United States Patent
Wei et al.

(10) Patent No.: US 11,342,925 B2
(45) Date of Patent: May 24, 2022

(54) SIGNAL GENERATION CIRCUIT AND METHOD, AND DIGIT-TO-TIME CONVERSION CIRCUIT AND METHOD

(71) Applicants: BEIJING BOE TECHNOLOGY DEVELOPMENT CO., LTD., Beijing (CN); BOE Technology Group Co., Ltd., Beijing (CN)

(72) Inventors: Xiangye Wei, Beijing (CN); Liming Xiu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/296,672

(22) PCT Filed: Aug. 13, 2020

(86) PCT No.: PCT/CN2020/108963
§ 371 (c)(1),
(2) Date: May 25, 2021

(87) PCT Pub. No.: WO2021/036805
PCT Pub. Date: Mar. 4, 2021

(65) Prior Publication Data
US 2022/0029627 A1    Jan. 27, 2022

(30) Foreign Application Priority Data
Aug. 30, 2019   (CN) .......................... 201910813647.9

(51) Int. Cl.
*G06F 1/08*       (2006.01)
*H03L 7/099*      (2006.01)
(Continued)

(52) U.S. Cl.
CPC .......... *H03L 7/0991* (2013.01); *G04F 10/005* (2013.01); *G06F 1/08* (2013.01);
(Continued)

(58) Field of Classification Search
CPC ......... G04F 10/005; G06F 1/08; H03L 7/0991
See application file for complete search history.

(56) References Cited

U.S. PATENT DOCUMENTS

| 9,379,714 B1 | 6/2016 | Xiu |
| 11,101,806 B2 * | 8/2021 | Wei ........................ H03L 7/0996 |

(Continued)

FOREIGN PATENT DOCUMENTS

| CN | 101674080 A | 3/2010 |
| CN | 102064853 A | 5/2011 |

(Continued)

OTHER PUBLICATIONS

Xiu, Liming et al., "A Full Digital Fractional-N TAF-FLL for Digital Applications: Demonstration of the Principle of a Frequency-Locked Loop Built on Time-Average-Frequency", IEEE Transactions On Very Large Scale Integration (VLSI) Systems, Mar. 2019, vol. 27, No. 3, pp. 524-534. (11 pages).

*Primary Examiner* — Patrick O Neill
(74) *Attorney, Agent, or Firm* — WHDA, LLP

(57) ABSTRACT

A signal generating electric circuit, a signal generating method, a digit-to-time converting electric circuit and a digit-to-time converting method. The signal generating electric circuit includes: a first generating electric circuit configured for, based on a first frequency control word and a reference time unit, generating a periodic first output signal; and a second generating electric circuit configured for, based on a second frequency control word and the reference time unit, generating a periodic second output signal. The first frequency control word includes a first integer part and a first
(Continued)

fractional part, the second frequency control word includes a second integer part and a second fractional part, the first integer part is equal to the second integer part, the first fractional part and the second fractional part are not equal, and a period of the first output signal and a period of the second output signal are not equal.

20 Claims, 21 Drawing Sheets

(51) Int. Cl.
  *G04F 10/00* (2006.01)
  *H03L 7/089* (2006.01)
  *H03L 7/24* (2006.01)
  *H03L 7/093* (2006.01)

(52) U.S. Cl.
  CPC .............. *H03L 7/089* (2013.01); *H03L 7/093* (2013.01); *H03L 7/24* (2013.01)

(56) References Cited

U.S. PATENT DOCUMENTS

| | | |
|---|---|---|
| 2014/0314133 A1 | 10/2014 | Hou et al. |
| 2018/0196460 A1 | 7/2018 | Xiu |
| 2019/0123749 A1* | 4/2019 | Xiu ............................ H03L 7/18 |
| 2019/0261472 A1* | 8/2019 | Xiu ......................... H03K 3/017 |
| 2021/0232175 A1* | 7/2021 | Li ............................ G06F 1/105 |

FOREIGN PATENT DOCUMENTS

| | | |
|---|---|---|
| CN | 104113381 A | 10/2014 |
| CN | 106708166 A | 5/2017 |
| CN | 110518906 A | 11/2019 |
| CN | 110518907 A | 11/2019 |

* cited by examiner

SIGNAL GENERATION CIRCUIT AND METHOD, AND DIGIT-TO-TIME CONVERSION CIRCUIT AND METHOD

CROSS REFERENCE TO RELEVANT APPLICATIONS

The present disclosure claims the priority of the Chinese patent application filed on Aug. 30, 2019 with the application number of 201910813647.9 and the title of "SIGNAL GENERATION CIRCUIT AND METHOD, AND DIGIT-TO-TIME CONVERSION CIRCUIT AND METHOD", which is incorporated herein in its entirety by reference.

TECHNICAL FIELD

The embodiments of the present disclosure relate to a signal generating electric circuit, a signal generating method, a digit-to-time converting electric circuit and a digit-to-time converting method.

BACKGROUND

With the rapid development and popularization of the Internet of Things, electronic systems such as sensors, Micro-Electro-Mechanical Systems (MEMS) and Integrated Circuits (IC) are being increasingly extensively applied.

The time of the chip in electronic systems may refer to the clock-signal period. Currently, the clock-signal periods are generally of the order of magnitude of nanoseconds. For example, if a clock-signal period is 20 nanoseconds (ns), then the precision of a counter that is obtained according to the clock signal may be 20 ns; in other words, the resolution of the counter cannot be less than 20 ns. However, such a resolution or precision can hardly satisfy the requirements by practical applications in the fields such as scientific research, military applications and consumer electronics. In addition, when the time period is small to a certain extent (for example, the order of magnitude of picoseconds), it will be difficult to control the parameters of the signal such as jittering and phase noise, and therefore the integrity of the signal cannot be ensured. Therefore, it is difficult to further increase the frequency and reduce the time period.

SUMMARY

At least an embodiment of the present disclosure provides a signal generating electric circuit. The signal generating electric circuit comprises: a first generating electric circuit configured for, based on a first frequency control word and a reference time unit, generating a periodic first output signal; and a second generating electric circuit configured for, based on a second frequency control word and the reference time unit, generating a periodic second output signal. The first frequency control word comprises a first integer part and a first fractional part, the second frequency control word comprises a second integer part and a second fractional part, the first integer part is equal to the second integer part, the first fractional part and the second fractional part are not equal, and a period of the first output signal and a period of the second output signal are not equal.

For example, in some examples, a periodic inequality between the period of the first output signal and the period of the second output signal is related to the reference time unit and a decimal difference between the first fractional part and the second fractional part.

For example, in some examples, the first generating electric circuit comprises a first digitally controlled oscillator sub-circuit and a first converting sub-circuit. The first digitally controlled oscillator sub-circuit is configured for, based on the first frequency control word and the reference time unit, generating a first intermediate signal. The first converting sub-circuit is configured for converting the first intermediate signal into the first output signal. The second generating electric circuit comprises a second digitally controlled oscillator sub-circuit and a second converting sub-circuit. The second digitally controlled oscillator sub-circuit is configured for, based on the second frequency control word and the reference time unit, generating a second intermediate signal. The second converting sub-circuit is configured for converting the second intermediate signal into the periodic second output signal. The first intermediate signal is generated by interlacing between a pulse having a first primitive period and a pulse having a second primitive period, and a first average period of the first intermediate signal is expressed by using the following formula:

$$T_h = (1-r_h) \cdot T_A + r_h \cdot T_B,$$

wherein $T_h$ represents the first average period of the first intermediate signal, $r_h$ represents the first fractional part, $T_A$ represents the first primitive period, and $T_B$ represents the second primitive period.

The second intermediate signal is generated by interlacing between a pulse having the first primitive period and a pulse having the second primitive period, and a second average period of the second intermediate signal is expressed by using the following formula:

$$T_l = (1-r_l) \cdot T_A + r_l \cdot T_B,$$

wherein $T_l$ represents the second average period of the second intermediate signal, and $r_l$ represents the second fractional part.

For example, in some examples, the first converting sub-circuit comprises a first filter, and the first filter is configured for filtering out a high-frequency component of the first intermediate signal to obtain the first output signal.

For example, in some examples, parameters of the first filter are determined according to a mean frequency of the first intermediate signal and a least significant bit of the first fractional part.

For example, in some examples, the parameters of the first filter include a bandwidth of the first filter, and the bandwidth of the first filter is determined according to the following formula:

$$Bwlp1 \leq f_{h1} \cdot r_{LSB1},$$

wherein Bwlp1 is the bandwidth of the first filter, $r_{LSB1}$ is a value corresponding to the least significant bit of the first fractional part, $$f_{h1} = \frac{1}{F_h \cdot \Delta}$$

is a mean frequency of the first intermediate signal, $F_h$ is the first frequency control word, and $\Delta$ is the reference time unit.

For example, in some examples, the second converting sub-circuit comprises a second filter, and the second filter is configured for filtering out a high-frequency component of the second intermediate signal to obtain the second output signal.

For example, in some examples, parameters of the second filter are determined according to a mean frequency of the second intermediate signal and a least significant bit of the second fractional part.

For example, in some examples, the parameters of the second filter include a bandwidth of the second filter, and the bandwidth of the second filter is determined according to the following formula:

$$Bwlp2 \le f_{h2} \cdot r_{LSB2},$$

wherein Bwlp2 represents the bandwidth of the second filter, $r_{LSB2}$ is a value corresponding to the least significant bit of the second fractional part, is a mean frequency of the second intermediate signal, $F_I$ is the second frequency control word, and $\Delta$ is the reference time unit.

For example, in some examples, both of the first digitally controlled oscillator sub-circuit and the second digitally controlled oscillator sub-circuit comprise a time-average-frequency direct-period synthesizer.

For example, in some examples, the signal generating electric circuit further comprises a reference-time-unit generating electric circuit, and the reference-time-unit generating electric circuit is configured for generating the reference time unit.

For example, in some examples, the reference-time-unit generating electric circuit comprises a plurality of D triggers.

For example, in some examples, the reference-time-unit generating electric circuit comprises: a voltage-controlled oscillator configured for oscillating with a preset oscillation frequency; a phase-locked-loop circuit configured for locking an output frequency of the voltage-controlled oscillator as a reference output frequency; and K output terminals configured for outputting K output signals whose phases are evenly separated, wherein K is a positive integer greater than 1. The reference output frequency is expressed as $f_\Delta$, the reference time unit is a time span between any two neighboring output signals outputted by the K output terminals, the reference time unit is expressed as $\Delta$, and $\Delta = 1/(K \cdot f_\Delta)$.

For example, in some examples, the signal generating electric circuit further comprises: a control circuit. The control circuit is configured for determining the first frequency control word and the second frequency control word, outputting the first frequency control word to the first generating electric circuit, and outputting the second frequency control word to the second generating electric circuit.

At least an embodiment of the present disclosure further provides a digit-to-time converting electric circuit. The digit-to-time converting electric circuit comprises: any one of the signal generating electric circuits described above; and a time generating electric circuit configured for receiving a digital signal, the first output signal and the second output signal; and based on the digital signal, the first output signal and the second output signal, generating a first time-pulse signal or a second time-pulse signal corresponding to the digital signal. A first minimum time interval between a rising edge and a falling edge of the first time-pulse signal is related to the reference time unit, the first fractional part and the second fractional part; or, the second time-pulse signal comprises a first sub-pulse signal and a second sub-pulse signal, and a second minimum time interval between a rising edge of the first sub-pulse signal and a rising edge of the second sub-pulse signal is related to the reference time unit, the first fractional part and the second fractional part.

For example, in some examples, the digit-to-time converting electric circuit further comprises a phase-detector circuit. The phase-detector circuit is configured for determining a phase relation between the first output signal and the second output signal, to generate an indicator signal indicating that a phase of the first output signal and a phase of the second output signal are aligned. The time generating electric circuit is configured for, based on the digital signal, the first output signal, the second output signal and the indicator signal, generating the first time-pulse signal or the second time-pulse signal.

For example, in some examples, the first generating electric circuit comprises a first digitally controlled oscillator sub-circuit configured for, based on the first frequency control word and the reference time unit, generating a first intermediate signal and a first converting sub-circuit configured for converting the first intermediate signal into the first output signal, and the second generating electric circuit comprises a second digitally controlled oscillator sub-circuit configured for, based on the second frequency control word and the reference time unit, generating the second intermediate signal and a second converting sub-circuit configured for converting the second intermediate signal into the periodic second output signal. The first generating electric circuit is further configured for, when generating the first intermediate signal, outputting a first rising-edge control word corresponding to a rising edge of the first intermediate signal, a first falling-edge control word corresponding to a falling edge of the first intermediate signal and a first decimal-frequency control word corresponding to period switching of the first intermediate signal. The second generating electric circuit is further configured for, when generating the second intermediate signal, outputting a second rising-edge control word corresponding to the rising edge of the second intermediate signal, a second falling-edge control word corresponding to the falling edge of the second intermediate signal and a second decimal-frequency control word corresponding to period switching of the second intermediate signal. The phase-detector circuit is configured for, based on the first rising-edge control word, the second rising-edge control word, the first falling-edge control word, the second falling-edge control word, the first decimal-frequency control word and the second decimal-frequency control word, generating the indicator signal.

For example, in some examples, the phase-detector circuit is configured for, when the first rising-edge control word is equal to the second rising-edge control word, the first falling-edge control word is equal to the second falling-edge control word and both of the first decimal-frequency control word and the second decimal-frequency control word are equal to zero, generating the indicator signal.

For example, in some examples, the first minimum time interval or the second minimum time interval is expressed as:

$$DeltaT = n \cdot t_R,$$

wherein DeltaT represents the first minimum time interval or the second minimum time interval, n represents a bit width of the digital signal, $t_R$ represents a periodic inequality between the period of the first output signal and the period of the second output signal, and $t_R$ is expressed as:

$$t_R = (r_h - r_l) \cdot \Delta,$$

wherein $r_h$ represents the first fractional part of the first frequency control word, $r_l$ represents the second fractional part of the second frequency control word, and $\Delta$ represents the reference time unit.

At least an embodiment of the present disclosure further provides a signal generating method. The signal generating method comprises: based on a first frequency control word and a reference time unit, generating a periodic first output signal; and based on a second frequency control word and the reference time unit, generating a periodic second output signal. The first frequency control word comprises a first integer part and a first fractional part, the second frequency control word comprises a second integer part and a second fractional part, the first integer part is equal to the second integer part, the first fractional part and the second fractional part are not equal, and a period of the first output signal and a period of the second output signal are not equal.

For example, in some examples, a periodic inequality between the period of the first output signal and the period of the second output signal is related to the reference time unit and a decimal difference between the first fractional part and the second fractional part.

For example, in some examples, the step of, based on the first frequency control word and the reference time unit, generating the periodic first output signal comprises: based on the first frequency control word and the reference time unit, generating a first intermediate signal; and converting the first intermediate signal into the first output signal. The step of based on a second frequency control word and the reference time unit, generating a periodic second output signal comprises: based on the second frequency control word and the reference time unit, generating a second intermediate signal; and converting the second intermediate signal into the second output signal.

The first intermediate signal is generated by interlacing between a pulse having a first primitive period and a pulse having a second primitive period, and a first average period of the first intermediate signal is expressed by using the following formula:

$$T_h = (1-r_h) \cdot T_A + r_h \cdot T_B,$$

wherein $T_h$ represents the first average period of the first intermediate signal, $r_h$ represents the first fractional part, $T_A$ represents the first primitive period, and $T_B$ represents the second primitive period.

the second intermediate signal is generated by interlacing between a pulse having the first primitive period and a pulse having the second primitive period, and a second average period of the second intermediate signal is expressed by using the following formula:

$$T_l = (1-r_l) \cdot T_A + r_l \cdot T_B,$$

wherein $T_l$ represents the second average period of the second intermediate signal, $r_l$ represents the second fractional part, $T_A$ represents the first primitive period, and $T_B$ represents the second primitive period.

For example, in some examples, the step of converting the first intermediate signal into the first output signal comprises: filtering out a high-frequency component of the first intermediate signal, to convert the first intermediate signal into the first output signal.

For example, in some examples, the step of converting the second intermediate signal into the second output signal comprises: filtering out a high-frequency component of the second intermediate signal, to convert the second intermediate signal into the second output signal.

At least an embodiment of the present disclosure further provides a digit-to-time converting method applied to the digit-to-time converting electric circuit described above. The digit-to-time converting method comprises: receiving the digital signal, the first output signal and the second output signal; and based on the digital signal, the first output signal and the second output signal, generating a first time-pulse signal or a second time-pulse signal corresponding to the digital signal.

For example, in some examples, the digit-to-time converting method further comprises: determining a phase relation between the first output signal and the second output signal, to generate an indicator signal indicating that a phase of the first output signal and a phase of the second output signal are aligned. The step of, based on the digital signal, the first output signal and the second output signal, generating the first time-pulse signal or the second time-pulse signal corresponding to the digital signal comprises: based on the digital signal, the first output signal, the second output signal and the indicator signal, generating the first time-pulse signal or the second time-pulse signal.

For example, in some examples, the step of, based on the first frequency control word and the reference time unit, generating the periodic first output signal comprises: based on the first frequency control word and the reference time unit, generating a first intermediate signal, and converting the first intermediate signal into the first output signal. The step of based on a second frequency control word and the reference time unit, generating a periodic second output signal comprises based on the second frequency control word and the reference time unit, generating a second intermediate signal, and converting the second intermediate signal into the second output signal. The digit-to-time converting method further comprises: when generating the first intermediate signal, obtaining a first rising-edge control word corresponding to a rising edge of the first intermediate signal, a first falling-edge control word corresponding to a falling edge of the first intermediate signal and a first decimal-frequency control word corresponding to period switching of the first intermediate signal; and when generating the second intermediate signal, obtaining a second rising-edge control word corresponding to the rising edge of the second intermediate signal, a second falling-edge control word corresponding to the falling edge of the second intermediate signal and a second decimal-frequency control word corresponding to period switching of the second intermediate signal. The step of determining the phase relation between the first output signal and the second output signal to generate the indicator signal comprises: based on the first rising-edge control word, the second rising-edge control word, the first falling-edge control word, the second falling-edge control word, the first decimal-frequency control word and the second decimal-frequency control word, generating the indicator signal.

For example, in some examples, the step of based on the first rising-edge control word, the second rising-edge control word, the first falling-edge control word, the second falling-edge control word, the first decimal-frequency control word and the second decimal-frequency control word, generating the indicator signal indicating that the phase of the first output signal and the phase of the second output signal are aligned comprises: when the first rising-edge control word is equal to the second rising-edge control word, the first falling-edge control word is equal to the second falling-edge control word and both of the first decimal-frequency control word and the second decimal-frequency control word are equal to zero, generating the indicator signal.

BRIEF DESCRIPTION OF THE DRAWINGS

In order to more clearly illustrate the technical solutions of the embodiments of the present disclosure, the figures of the embodiments of the present disclosure will be briefly introduced below. Apparently, the figures that are described below merely involve some embodiments of the present disclosure, rather than limiting the present disclosure.

DETAILED DESCRIPTION

Figure 1A:
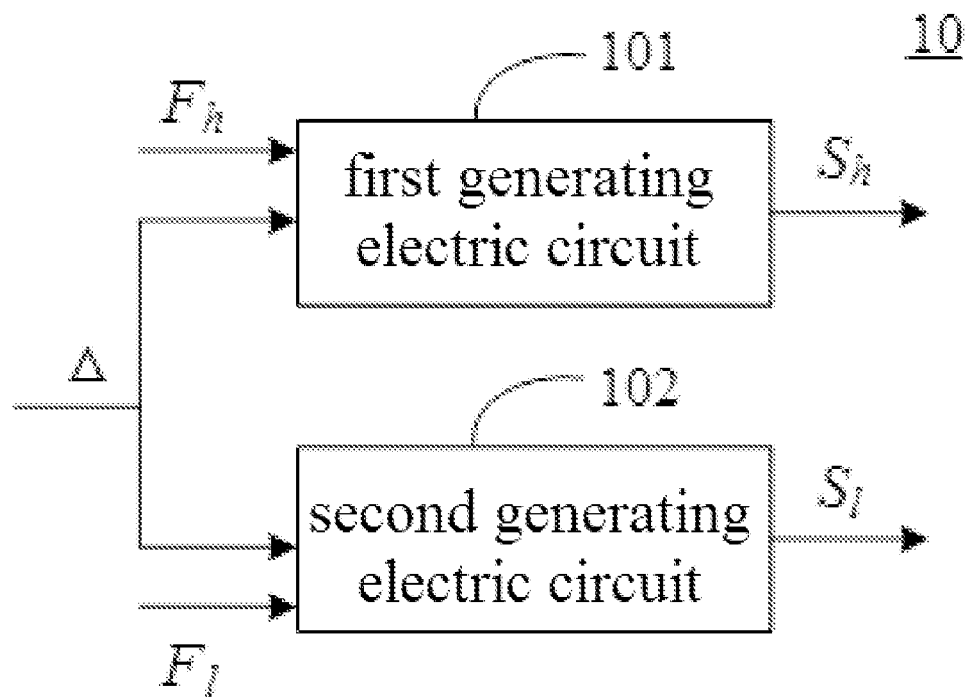
FIG. 1A shows a schematic block diagram of the signal generating electric circuit according to some embodiments of the present disclosure.

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the described embodiments of the present disclosure without paying creative work fall within the protection scope of the present disclosure.

The terms used herein for the description of the embodiments of the present disclosure are not intended to limit and/or define the scope of the present disclosure. For example, unless defined otherwise, the technical terminologies or scientific terminologies used in the present disclosure should have the meanings generally understood by a person skilled in the art of the present disclosure. It should be understood that the words used herein such as "first" and "second" do not indicate any sequence, quantity or importance, but are merely intended to distinguish different components. Unless explicitly indicated otherwise in the context, the words in the singular form such as "a", "an" or "the" do not indicate quantitative limitations, but indicate the existence of at least one instance.

It should be further understood that the words such as "comprise" or "include" mean that the element or article preceding the word encompasses the elements or articles and the equivalents thereof that are listed subsequent to the word, but do not exclude other elements or articles. The words such as "connect" or "couple" are not limited to physical or mechanical connections, but may include electric connections, regardless of direct connections or indirect connections. The words such as "upper", "lower", "left" and "right" are merely intended to indicate relative positions, and if the absolute position of the described item has changed, the relative positions might also be correspondingly changed.

Digit-to-time conversion may refer to converting the digital information inputted by the user into a pulse signal of the corresponding time duration length. For example, if an integer n is inputted, a pulse whose time duration length is $n \cdot T_R$ may be obtained, wherein $T_R$ is the minimum resolution of the pulse. For example, the digit-to-time conversion may be performed by using approaches such as the traditional delay method, the variable-slope charging method, the vernier method and the edge-interpolation method. The traditional delay method may be performed by using a snubber. Because the snubber is highly influenced by environmental factors and has a poor signal stability, the traditional delay method cannot ensure the time accuracy and precision. The variable-slope charging method has a poor linearity, and thus cannot ensure the time accuracy. The vernier method can hardly detect the phase of the pulse signal, and, with the enlargement of the test range, the quantity of the logic devices that are required is increased geometrically. The edge-interpolation method requires to add resistors into the electric circuits, with increases the power consumption and the occupation.

The embodiments of the present disclosure provide a signal generating electric circuit, a signal generating method, a digit-to-time converting electric circuit and a digit-to-time converting method. The electric circuits and methods according to the embodiments of the present disclosure (for example, the signal generating electric circuit, the signal generating method, the digit-to-time converting electric circuit and the digit-to-time converting method) can been simply implemented, and can obtain extremely high time precision and accuracy. For example, by using the signal generating electric circuit or the signal generating method according to the embodiments of the present disclosure, the method based on time average frequency can obtain a pulse signal having an extremely small periodic inequality (for example, of the order of magnitude of picoseconds). For example, by using the digit-to-time converting electric circuit or the digit-to-time converting method according to the embodiments of the present disclosure, a time-interval pulse having a sufficiently small time resolution and having extremely high stability and accuracy can be obtained.

The electric circuits and methods according to the embodiments of the present disclosure may be applied to various fields such as very-large-scale integration functional tester (VLSI Functional Tester), Timing Generator, IC Pulse Parametric Tester, phase-locked loop (PLL), Sampling Oscilloscope, Automatic Test Equipment (ATE), Direct Digital Frequency Synthesizer (DDFS), Polar Transmitter and Radar.

The embodiments of the present disclosure will be described in detail below with reference to the drawings. It should be noted that the same reference numbers in different figures refer to the same elements that have been described.

Figure 1B:
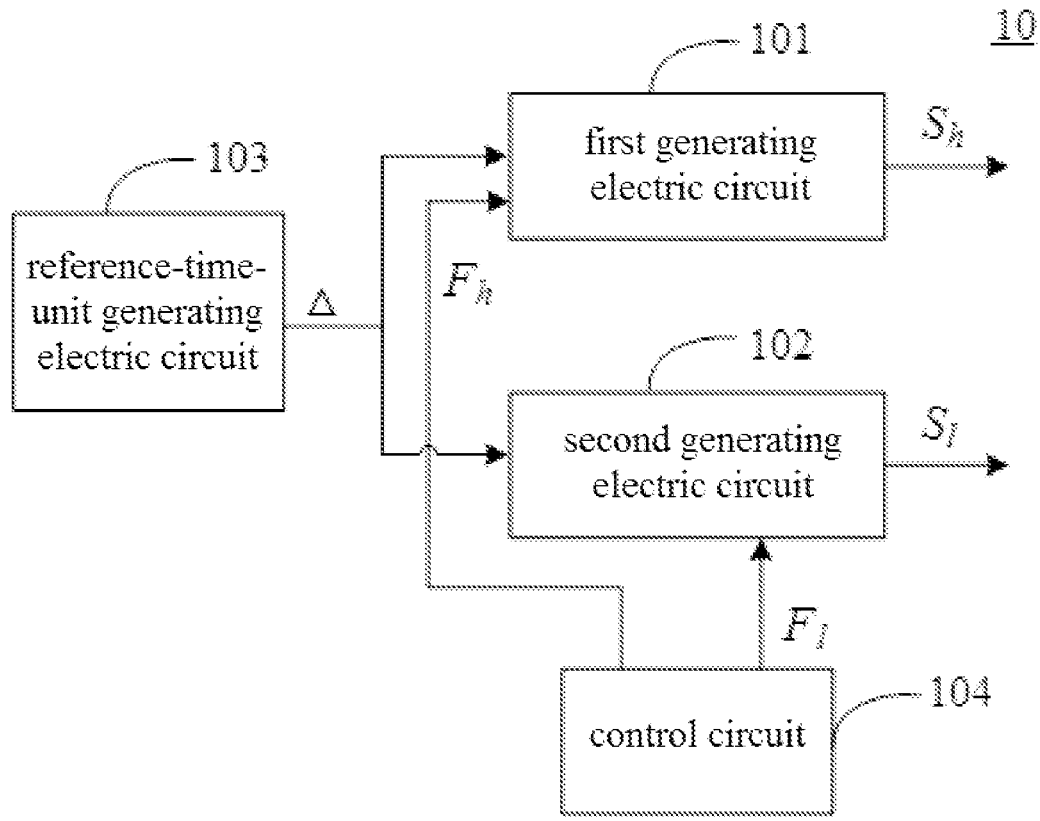
FIG. 1B shows a schematic block diagram of the signal generating electric circuit according to some embodiments of the present disclosure.

At least an embodiment of the present disclosure provides a signal generating electric circuit. FIGS. 1A to 1B show a block diagram of the signal generating electric circuit according to some embodiments of the present disclosure.

Referring to FIG. 1A, the signal generating electric circuit 10 according to at least an embodiment of the present disclosure may comprise a first generating electric circuit 101 and a second generating electric circuit 102. The first generating electric circuit 101 may be configured for, based on a first frequency control word $F_h$ and a reference time unit $\Delta$, generating a periodic first output signal $S_h$. The second generating electric circuit 102 may be configured for, based on the second frequency control word $F_l$ and the reference time unit $\Delta$, generating the periodic second output signal $S_l$. For example, the period of the first output signal $S_h$ and the period of the second output signal $S_l$ are not equal.

For example, the time difference between the time duration length of the period of the first output signal $S_h$ and the time duration length of the period of the second output signal $S_l$ represents the time resolution. In some embodiments of the present disclosure, the time resolution may reach the order of magnitude of femtoseconds.

In some embodiments, the periodic inequality between the period of the first output signal $S_h$ and the period of the second output signal $S_l$ may be related to the reference time unit $\Delta$, the first frequency control word $F_h$ and the second frequency control word $F_l$. For example, the periodic inequality between the period of the first output signal $S_h$ and the period of the second output signal $S_l$ is related to the reference time unit $\Delta$ and the decimal difference between the first fractional part and the second fractional part.

In some embodiments, the reference time unit $\Delta$ may be the time span (for example, phase difference) between any two neighboring reference signals of K reference signals whose phases are evenly separated, wherein K is a positive integer greater than 1. Therefore, the reference time unit $\Delta$ may correspond to K reference signals whose phases are evenly separated. For example, the inputting the reference time unit $\Delta$ into the first generating electric circuit 101 and the second generating electric circuit 102, as shown in some figures (for example, FIG. 1A) of the embodiments of the present disclosure, may represent inputting K reference signals whose phases are evenly separated corresponding to the reference time unit $\Delta$ into the first generating electric circuit 101 and the second generating electric circuit 102.

In some embodiments, as shown in FIG. 1B, the signal generating electric circuit 10 may further comprise a reference-time-unit generating electric circuit 103. For example, the reference-time-unit generating electric circuit 103 may be configured for generating K reference signals whose phases are evenly separated, wherein the time span (for example, phase difference) between any two neighboring reference signals of K reference signals whose phases are evenly separated is the reference time unit $\Delta$. For example, the reference-time-unit generating electric circuit 103 may be implemented by using a twisted-ring counter (i.e., a Johnson Counter). For example, the reference-time-unit generating electric circuit 103 may be implemented by using multiple stages of voltage-controlled oscillators. Some examples of the configuration of the reference-time-unit generating electric circuit 103 according to the embodiments of the present disclosure will be described below with reference to FIGS. 8 and 9.

In some embodiments, the first frequency control word $F_h$ may comprise a first integer part and a first fractional part, the second frequency control word $F_l$ may comprise a second integer part and a second fractional part, the first integer part and the second integer part are equal, and the first fractional part and the second fractional part are not equal. For example, the first frequency control word $F_h$ may be 8.25, and the second frequency control word $F_l$ may be 8.125; in other words, the first integer part is 8, the first fractional part is 0.25, the second integer part is 8, and the second fractional part is 0.125.

In some embodiments, one of the first frequency control word $F_h$ and the second frequency control word $F_l$ may be an integer; in other words, the first fractional part or the second fractional part may be 0. For example, in some examples, the first fractional part is not zero, and the second fractional part is zero. For example, the first frequency control word $F_h$ may be 8.125, and the second frequency control word $F_l$ may be 8. At this point, the first integer part is 8, the first fractional part is 0.125, the second integer part is 8, and the second fractional part is 0.

In some embodiments, both of the first frequency control word $F_h$ and the second frequency control word $F_l$ are an integer. In other words, both of the first fractional part and the second fractional part may be 0. For example, the first frequency control word $F_h$ may be 9, and the second frequency control word $F_l$ may be 8. At this point, the first integer part is 9, the first fractional part is 0, the second integer part is 8, and the second fractional part is 0. In such a case, the periodic inequality between the period of the first output signal $S_h$ and the period of the second output signal $S_l$ is related to the reference time unit $\Delta$ and the difference between the first integer part and the second integer part.

In an embodiment of the present disclosure, the fractional parts and the integer parts of the frequency control words (for example, the first frequency control word $F_h$ or the second frequency control word Fi) may be determined by using the radix point of the frequency control words as the delimiting symbol. For example, regarding the frequency control word F=I+r, wherein I is an integer and r is a decimal greater than or equal to zero and less than 1, its integer part is I, and its fractional part is r. In an embodiment of the present disclosure, if the fractional part r of the frequency control word is zero, or, in other words, the frequency control word is an integer, then it can be considered that the frequency control word does not have a fractional part.

Below will be described an embodiment of the signal generating electric circuit 10 in a case in which both of the first frequency control word $F_h$ and the second frequency control word $F_l$ comprise a corresponding fractional part (in other words, neither of the first fractional part nor the second fractional part is 0), and an embodiment of the signal generating electric circuit 10 in a case in which the second frequency control word $F_l$ is an integer (the second fractional part is 0).

In some embodiments, as shown in FIG. 1B, the signal generating electric circuit 10 may further comprise a control circuit 104. The control circuit 104 may be configured for determining the first frequency control word $F_h$ and the second frequency control word $F_l$, outputting the first frequency control word $F_h$ into the first generating electric circuit 101, and outputting the second frequency control word $F_l$ into the second generating electric circuit 102. For example, the first frequency control word $F_h$ and the second frequency control word $F_l$ may be inputted into the control circuit 104 by the user by using an input device. For example, the first frequency control word $F_h$ and the second frequency control word $F_l$ may be pre-stored in a storage device, and may be read by the control circuit 104. For example, the first frequency control word $F_h$ and the second frequency control word $F_l$ may also be generated automatically by the control circuit 104.

Figure 2:
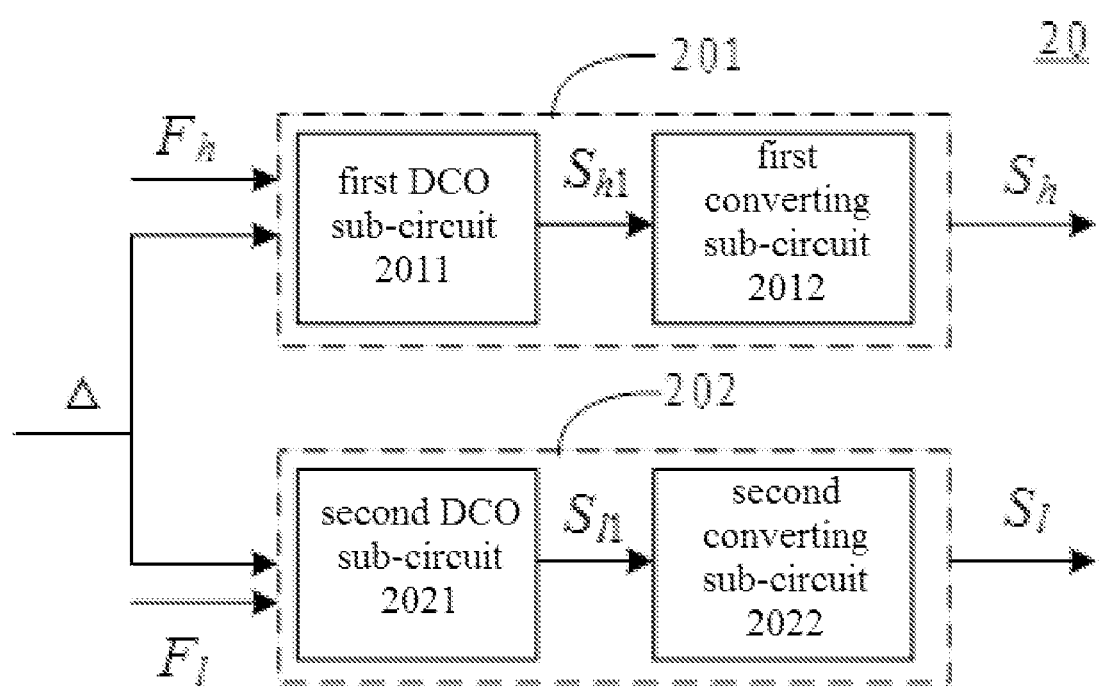
FIG. 2 shows a block diagram of the signal generating electric circuit, when both of the first frequency control word and the second frequency control word comprise a corresponding fractional part, according to some embodiments of the present disclosure.

FIG. 2 shows a block diagram of the signal generating electric circuit in a case in which both of the first frequency control word $F_h$ and the second frequency control word $F_l$ comprise a corresponding fractional part according to some embodiments of the present disclosure. In the example shown in FIG. 2, the first frequency control word $F_h$ may comprise a first integer part and a first fractional part, the second frequency control word $F_l$ may comprise a second integer part and a second fractional part, the first integer part and the second integer part are equal, and the first fractional part and the second fractional part are not equal. For example, both of the first fractional part and the second fractional part may not be equal to 0.

Referring to FIG. 2, in some examples, a signal generating electric circuit 20 may comprise a first generating electric circuit 201 and a second generating electric circuit 202. The first generating electric circuit 201 may comprise a first Digitally Controlled Oscillator (DCO) sub-circuit 2011 and a first converting sub-circuit 2012. The second generating electric circuit 202 may comprise a second DCO sub-circuit 2021 and a second converting sub-circuit 2022.

For example, the first DCO sub-circuit 2011 may be configured for, based on a first frequency control word $F_h$ and a reference time unit $\Delta$, generating a first intermediate signal $S_{h1}$, and the first converting sub-circuit 2012 may be configured for converting the first intermediate signal $S_{h1}$ into the first output signal $S_h$.

For example, the second DCO sub-circuit 2021 may be configured for, based on a second frequency control word $F_l$ and the reference time unit $\Delta$, generating a second intermediate signal $S_{l1}$, and the second converting sub-circuit 2022 may be configured for converting the second intermediate signal $S_{l1}$ into the second output signal $S_l$.

Exemplary embodiments of the first DCO sub-circuit 2011 and the first converting sub-circuit 2012 will be described below.

In some embodiments, the first DCO sub-circuit 2011 may be implemented based on Time Average Frequency (TAF). The principle of the technique of TAF will be described simply below with reference to FIG. 3.

Figure 3:
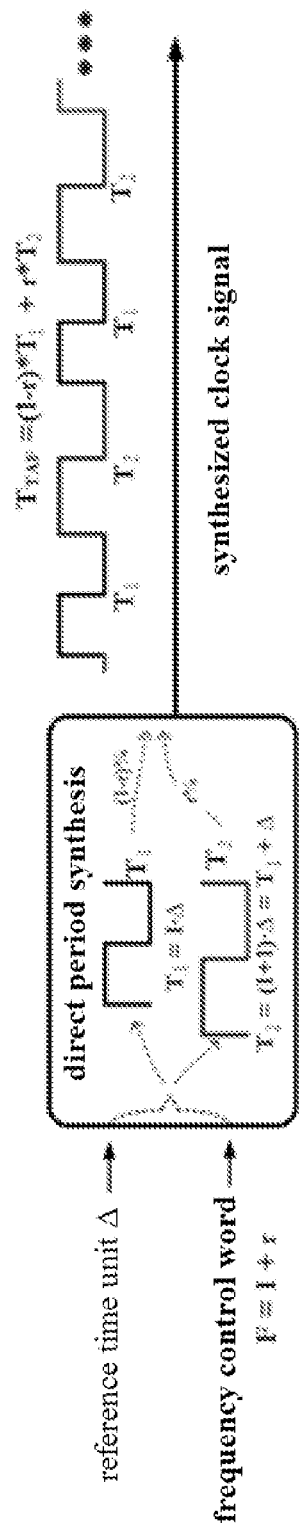
FIG. 3 shows a schematic diagram of the principle of the time average frequency according to some embodiments of the present disclosure.

As different from traditional clock signals, which have merely one period, the approaches based on the technique of TAF can utilize two or more periods having different lengths to generate the clock frequency. The case will be taken as an example for description below in which the technique of TAF utilizes two pulses of different time periods (a first period $T_1$ and a second period $T_2$) to synthesize the clock signal. Referring to FIG. 3, regarding the reference time unit $\Delta$ and a frequency control word F=I+r, wherein I is the integer part of the frequency control word F, and r is the fractional part of the frequency control word F, two time periods may be obtained: a first period $T_1$ and a second period $T_2$. The first period $T_1$ and the second period $T_2$ may be expressed by using Formula (1) and Formula (2) respectively.

$$T_1 = I \cdot \Delta \qquad \text{Formula (1)}$$

$$T_2 = (I+1) \cdot \Delta \qquad \text{Formula (2)}$$

By using the first period $T_1$ and the second period $T_2$, a clock signal comprising two different periods (different frequencies) may be generated by interlacing. The average period of the generated clock signal is $T_{TAF}$, as shown in Formula (3). The mean frequency of the generated clock signal is $1/T_{TAF}$.

$$T_{TAF} = (1-r) \cdot T_1 + r \cdot T_2 \qquad \text{Formula (3)}$$

It can be seen from Formula (3) that the fractional part r of the frequency control word F can control the probability of the emergence of the second period $T_2$. In other words, the fractional part r of the frequency control word F can control the switching frequency between the first period $T_1$ and the second period $T_2$ (referred to hereinafter as period switching). For example, when r=0.4, the generated clock signal may be obtained by the periodic cycling of the mode of $T_1T_1T_2T_1T_2$, i.e., $T_1T_1T_2T_1T_2T_1T_1T_2T_1T_2T_1T_1T_2T_1T_2 \ldots$. For example, when r=0.5, the generated clock signal is obtained by the periodic cycling of the mode of $T_1T_2$, i.e., $T_1T_2T_1T_2T_1T_2 \ldots$. The waveform of the clock signal shown in FIG. 3 corresponds to the clock signal generated when r=0.5.

In an embodiment of the present disclosure, in order to distinguish the period used by the approach based on the technique of TAF and the period of the clock signal generated based on the technique of TAF, the two different periods $T_1$ and $T_2$ used by the approach based on the technique of TAF may be referred to as the original periods, and the period $T_{TAF}$ of the clock signal generated based on the technique of TAF may be referred to as the average period. Correspondingly, the frequency $1/T_{TAF}$ of the clock signal generated based on the technique of TAF may be referred to as the mean frequency. It should be noted that, when r=0 (in other words, the frequency control word does not comprise the fractional part), although the clock signal generated based on the technique of TAF has one period, the period $T_{TAF}$ of the generated clock signal is still referred to as the average period, so as to be consistent with the above description.

A particular example of generating the clock frequency based on the technique of TAF will be described below. For example, if it is intended to synthesize a frequency of 49.9 MHz, traditional approaches can merely establish it by using a pulse signal having one period (for example, 20.04 ns). Based on the technique of TAF, a frequency of 49.9 MHz (the average period is 20*3/5+20.1*2/5=20.04 ns) may be obtained by using the first period $T_1$ (for example, 20 ns) and the second period $T_2$ (for example, 20.1 ns), by the periodic cycling of the mode of $T_1T_1T_2T_1T_2$ (corresponding to the fractional part r=0.4 of the frequency control word F). In addition, a frequency of 49.9 MHz (the average period is 20*½+20.08*½=20.04 ns) may be obtained by using the first period $T_1$ (for example, 20 ns) and the second period $T_2$ (for example, 20.08 ns), by the periodic cycling of the mode of $T_1T_2$ (corresponding to the fractional part r=0.5 of the frequency control word F).

The fundamental principle of the technique of TAF has been described above. Based on the technique of TAF, the first DCO sub-circuit 2011 may be implemented.

In some embodiments, based on the technique of TAF, the first intermediate signal $S_{h1}$ generated by the first DCO sub-circuit 2011 is generated by the interlacing between the first primitive period (for example, corresponding to the first period $T_1$ described above) and the second primitive period (for example, corresponding to the second period $T_2$ described above). In other words, the first intermediate signal $S_{h1}$ is generated by the interlacing between a pulse having the first primitive period and a pulse having the second primitive period. The first average period $T_h$ of the generated first intermediate signal $S_{h1}$ may be expressed by using Formula (4).

$$T_h = (1-r_h) \cdot T_A + r_h \cdot T_B \qquad \text{Formula (4)}$$

In Formula (4), $T_h$ represents the first average period of the first intermediate signal $S_{h1}$, $r_h$ represents the first fractional part of the first frequency control word $F_h$, $T_A = I_h \cdot \Delta$ represents the first primitive period, $T_B = (I_h+1) \cdot \Delta$ represents the second primitive period, and $I_h$ represents the first integer part of the first frequency control word $F_h$.

Exemplary embodiments of the first DCO sub-circuit 2011 have been described above. The second DCO sub-circuit 2021 may be implemented by using approaches same as or similar to those of the first DCO sub-circuit 2011; in other words, the second DCO sub-circuit 2021 may have the structure the same as or similar to that of the first DCO sub-circuit 2011. It should be noted that the second DCO sub-circuit 2021 may also be implemented by using an approach different from that of the first DCO sub-circuit 2011.

In some embodiments, the second intermediate signal $S_{l1}$ generated by the second DCO sub-circuit 2021 is generated by the interlacing between the first primitive period and the second primitive period; in other words, the second intermediate signal $S_l$ is also generated by the interlacing between a pulse having the first primitive period and a pulse having the second primitive period. Referring to the above formulas (1) and (2), because the first integer part of the first frequency control word $F_h$ and the second integer part of the second frequency control word $F_l$ are equal, the original periods used for synthesizing the first intermediate signal $S_{h1}$ and the second intermediate signal $S_{l1}$ are the same, or, in other words, are all the first primitive period and the second primitive period.

For example, the second average period $T_l$ of the second intermediate signal $S_{l1}$ may be expressed by using Formula (5):

$$T_l = (1-r_l) \cdot T_A + r_l \cdot T_B \qquad \text{Formula (5)}$$

In Formula (5), $T_l$ represents the second average period of the second intermediate signal $S_{l1}$, $r_l$ represents the second fractional part of the second frequency control word $F_l$, $T_A = I_l \cdot \Delta$ represents the first primitive period, $T_B = (I_l+1) \cdot \Delta$ represents the second primitive period, $I_l$ represents the second integer part of the second frequency control word $F_l$, $I_l = I_h$, and $\Delta$ represents the reference time unit.

Figure 4:
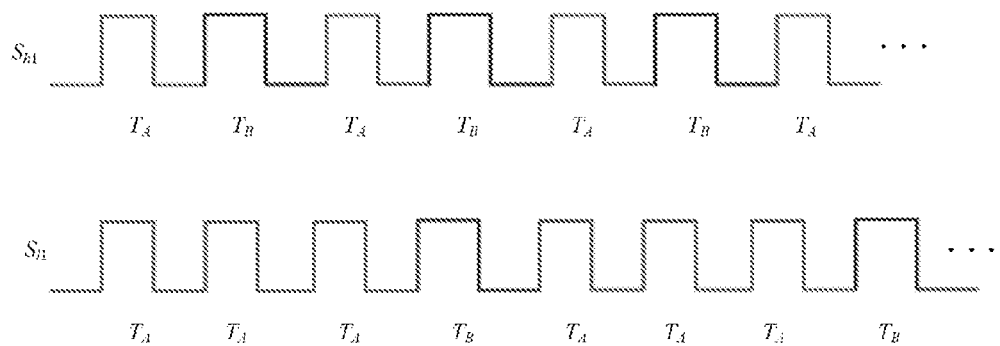
FIG. 4 shows a diagram of the waveform of the first intermediate signal and the waveform of the second intermediate signal, when $r_h$=0.5 and $r_f$=0.25, according to some embodiments of the present disclosure.

FIG. 4 shows the waveform of the first intermediate signal $S_{h1}$ and the waveform of the second intermediate signal $S_{l1}$, when $r_h$=0.5 and $r_l$=0.25, according to an embodiment of the present disclosure. Referring to FIG. 4, when $r_h$=0.5 and $r_l$=0.25, the first intermediate signal $S_{h1}$ is periodically cycled in the mode of $T_A T_B$, and the second intermediate signal $S_{l1}$ is periodically cycled in the mode of $T_A T_A T_A T_B$. Accordingly, the first average period $T_h$ of the first intermediate signal $S_{h1}$ may be $(T_A+T_B)/2$, and the second average period $T_l$ of the second intermediate signal $S_{l1}$ may be $(3T_A+T_B)/4$.

Embodiments in which the first DCO sub-circuit and the second DCO sub-circuit are implemented based on the technique of TAF have been described above. Based on the technique of TAF, the circuit architecture of Time Average Frequency-Direct Period Synthesis (TAF-DPS) can be realized. Therefore, in some embodiments, the first DCO sub-circuit 2011 and the second DCO sub-circuit 2021 may comprise a time-average-frequency direct-period synthesizer based on the TAF-DPS circuit architecture. The time-average-frequency direct-period synthesizer based on the TAF-DPS circuit architecture will be described below with reference to FIG. 10. It should be noted that the TAF-DPS circuit architecture is merely one implementation of the technique of TAF, and the embodiments of the present disclosure are not limited thereto. For example, in other embodiments, the first DCO sub-circuit 2011 and the second DCO sub-circuit 2021 may be implemented by using another electric circuit based on the technique of TAF.

In the embodiments in which the first DCO sub-circuit and the second DCO sub-circuit are implemented based on the technique of TAF, the frequency difference between the mean frequency of the first intermediate signal $S_{h1}$ and the mean frequency of the second intermediate signal $S_{l1}$ may be expressed by using Formula (6). In addition, the periodic inequality between the first average period $T_h$ of the first intermediate signal $S_{h1}$ and the second average period $T_l$ of the second intermediate signal $S_{l1}$ may be expressed by using Formula (7).

$$f_R = \frac{1}{T_l} - \frac{1}{T_h} = \frac{1}{F_l \cdot \Delta} - \frac{1}{F_h \cdot \Delta} = \frac{1}{(I_l+r_l) \cdot \Delta} - \frac{1}{(I_h+r_h) \cdot \Delta} \qquad \text{Formula (6)}$$

$$t'_R = T_h - T_l = F_h \cdot \Delta - F_l \cdot \Delta = (I_h+r_h) \cdot \Delta - (I_l+r_l) \cdot \Delta = (r_h - r_l) \cdot \Delta \qquad \text{Formula (7)}$$

In Formula (6) and Formula (7), $f_R$ represents the frequency difference between the mean frequency of the first intermediate signal $S_{h1}$ and the mean frequency of the second intermediate signal $S_{l1}$, $t_R'$ represents the periodic inequality between the first average period $T_h$ of the first intermediate signal $S_{h1}$ and the second average period $T_l$ of the second intermediate signal $S_{l1}$, $r_h$ represents the first fractional part of the first frequency control word $F_h$, $r_l$ represents the second fractional part of the second frequency control word $F_l$, $I_h$ represents the first integer part of the first frequency control word $F_h$, $I_l$ represents the second integer part of the second frequency control word $F_l$, $I_l=I_h$, and A represents the reference time unit. It can be seen from Formula (6) that the frequency difference between the mean frequency of the first intermediate signal $S_{h1}$ and the mean frequency of the second intermediate signal $S_{l1}$ may be determined according to the first fractional part of the first frequency control word $F_h$ and the second fractional part of the second frequency control word $F_l$, and when the difference between the first fractional part and the second fractional part is very small, the frequency difference between the mean frequency of the first intermediate signal $S_{h1}$ and the mean frequency of the second intermediate signal $S_{l1}$ is also very small. In addition, because the first average period $T_h$ of the first intermediate signal $S_{h1}$ is obtained by the time averaging between the first primitive period and the second primitive period, the second average period $T_l$ of the second intermediate signal $S_{l1}$ is also obtained by the time averaging between the first primitive period and the second primitive period; in other words, all of the periods of the first intermediate signal $S_{h1}$ are not equal to $T_h$, and all of the periods of the second intermediate signal $S_{l1}$ are not equal to T1. For example, the relation between the first primitive period $T_A$, the second primitive period $T_B$ and the first average period $T_h$ of the first intermediate signal $S_{h1}$ may satisfy: $T_A \leq T_l \leq T_B$. Therefore, the above Formula (7) merely represents the periodic inequality between the first average period $T_h$ of the first intermediate signal $S_{h1}$ and the second average period $T_l$ of the second intermediate signal $S_{l1}$. For example, the first average period $T_h$ of the first intermediate signal $S_{h1}$ is obtained by the averaging of $2^{u1}$ periods, wherein $u_1=-\log_2 r_{LSB1}$, and $r_{LSB1}$ is the value corresponding the least significant bit of the first fractional part of the first frequency control word $F_h$. Similarly, the second average period $T_l$ of the second intermediate signal $S_{l1}$ is obtained by the averaging of $2^{u2}$ periods, wherein $u_2=-\log_2 r_{LSB2}$, and $r_{LSB2}$ is the value corresponding to the least significant bit of the second fractional part of the second frequency control word $F_l$. For example, when $r_h=0.125$ (in other words, the binary value is 0.001 B), the value corresponding to the least significant bit of $r_h$ is 0.125. For example, when $r_h=0.75$ (in other words, the binary value is 0.11 B), the value corresponding to the least significant bit of $r_h$ is 0.25 (in other words, the binary value is 0.01 B). Formula (8) shows the first average period $T_h$ of the first intermediate signal $S_{h1}$ obtained by the averaging of $2^{u1}$ periods.

$$T_h = (1-r_h)\cdot T_A + r_h \cdot T_B = \frac{2^{u1}\cdot(1-r_h)\cdot T_A + 2^{u1}\cdot r_h \cdot T_B}{2^{u1}} \quad \text{Formula (8)}$$

In Formula (8), $u_1=-\log_2 r_{LSB1}$, and $r_{LSB1}$ is the value corresponding to the least significant bit of the first fractional part $r_h$ of the first frequency control word $F_h$.

In some embodiments, and the first converting sub-circuit 2012 may be configured for converting the first intermediate signal $S_{h1}$ into the first output signal $S_h$ having one period (i.e., the first average period).

For example, the first converting sub-circuit 2012 may comprise a first filter, and the first filter may be configured for filtering out a high-frequency component of the first intermediate signal $S_{h1}$ to obtain the first output signal $S_h$. Depending on the configuration of the first DCO sub-circuit 2011, the first intermediate signal $S_{h1}$ outputted by the first DCO sub-circuit 2011 comprises a high-frequency component and a low-frequency component. By filtering out the high-frequency component of the first intermediate signal $S_{h1}$, the first output signal $S_h$ comprising merely one period may be obtained. In other words, by using the first converting sub-circuit 2012, the first intermediate signal $S_{h1}$ can be converted into a traditional clock signal having one period. In some embodiments, the high-frequency component and the low-frequency component of the first intermediate signal $S_{h1}$ may be related to the speed or the frequency of the period switching of the first intermediate signal $S_{h1}$. As described above, the first intermediate signal $S_{h1}$ outputted by the first DCO sub-circuit 2011 may comprise two periods: the first primitive period $T_A$ and the second primitive period $T_B$, so the "period switching" according to some embodiments of the present disclosure may refer to the switching from the first primitive period $T_A$ to the second primitive period $T_B$ or from the second primitive period $T_B$ to the first primitive period $T_A$. For example, regarding the first intermediate signal $S_{h1}$, the frequency component whose frequency is greater than the minimum value of the speed or the frequency of the period switching of the first intermediate signal $S_{h1}$ is the high-frequency component of the first intermediate signal $S_{h1}$, and the frequency component whose frequency is less than or equal to the minimum value of the speed or the frequency of the period switching of the first intermediate signal $S_{h1}$ is the low-frequency component of the first intermediate signal $S_{h1}$. For example, the minimum value of the speed or the frequency of the period switching of the first intermediate signal $S_{h1}$ may be $f_{h1}\cdot r_{LSB}$ (for example, when $F_h$ is 8.125, it is $f_{h1}\cdot 0.125$), wherein $r_{LSB1}$ is the value corresponding to the least significant bit of the first fractional part $r_h$ of the first frequency control word $F_h$, and $f_{h1}$ is the mean frequency of the first intermediate signal $S_{h1}$. In such a case, the bandwidth of the first filter may be set to be less than or equal to $f_{h1}\cdot r_{LSB}$, thereby filtering out the high-frequency component of the first intermediate signal $S_{h1}$. Accordingly, the first output signal $S_h$ outputted by the first filter has merely one period.

Figure 5:
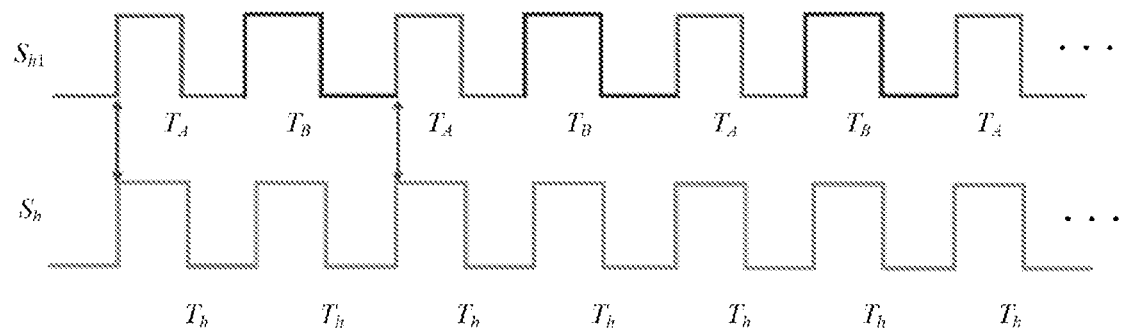
FIG. 5 shows a diagram of the waveform of the first intermediate signal and the waveform of the first output signal, when $r_h$=0.5, according to some embodiments of the present disclosure.

FIG. 5 shows the waveform of the first intermediate signal $S_{h1}$ and the waveform of the first output signal $S_h$, when $r_h=0.5$, according to an embodiment of the present disclosure. Referring to FIG. 5, after being processed by using the first converting sub-circuit 2012, the first intermediate signal $S_{h1}$ is converted into the first output signal $S_h$ having merely one type of period, wherein the value of the period of the first output signal $S_h$ is the value of the first average period $T_h$ of the first intermediate signal $S_{h1}$. For example, when $r_h=0.5$, the period of the first output signal $S_h$ is $(T_A+T_B)/2$.

For example, the parameters of the first filter may be determined according to the mean frequency of the first intermediate signal $S_{h1}$ and the least significant bit of the first fractional part $r_h$.

For example, the parameters of the first filter may include the bandwidth of the first filter, and the bandwidth of the first filter may be determined according to Formula (9).

$$\text{Bwlp1} \leq f_{h1}\cdot r_{LSB1} \quad \text{Formula (9)}$$

In Formula (9), Bwlp1 is the bandwidth of the first filter, $r_{LSB1}$ is the value corresponding to the least significant bit of the first fractional part $r_h$ of the first frequency control word $F_h$, $$f_{h1} = \frac{1}{F_h \cdot \Delta}$$

is the mean frequency of the first intermediate signal $S_{h1}$, and $\Delta$ is the reference time unit. In other words, it is merely required that the bandwidth of the first filter satisfies Formula (9), and then the first converting sub-circuit 2012 can filter out the high-frequency component of the first intermediate signal $S_{h1}$, to obtain the first output signal $S_h$ comprising merely one period.

For example, the first filter may be implemented as an analog filter or a digital filter. For example, the first filter is a low-pass filter.

In some embodiments, the second converting sub-circuit 2022 may be configured for converting the first intermediate signal $S_{h1}$ into the first output signal $S_h$ having one period (i.e., the second average period).

For example, the second converting sub-circuit 2022 may comprise a second filter, and the second filter may be configured for filtering out a high-frequency component of the second intermediate signal $S_{l1}$ to obtain the second output signal $S_l$. Depending on the configuration of the second DCO sub-circuit 2021, the second intermediate signal $S_{l1}$ outputted by the second DCO sub-circuit 2021 comprises a high-frequency component and a low-frequency component. By filtering out the high-frequency component of the second intermediate signal $S_{l1}$, the second output signal $S_l$ comprising merely one period may be obtained. In other words, by using the second converting sub-circuit 2022, the second intermediate signal $S_{l1}$ can be converted into a traditional clock signal having one period. In some embodiments, the high-frequency component and the low-frequency component of the second intermediate signal $S_{l1}$ may be related to the speed or the frequency of the period switching of the second intermediate signal $S_{l1}$. For example, regarding the second intermediate signal $S_{l1}$, the frequency component whose frequency is greater than the minimum value of the speed or the frequency of the period switching of the second intermediate signal $S_{l1}$ is the high-frequency component of the second intermediate signal $S_{l1}$, and the frequency component whose frequency is less than or equal to the minimum value of the speed or the frequency of the period switching of the second intermediate signal $S_{l1}$ is the low-frequency component of the second intermediate signal $S_{l1}$. For example, the minimum value of the speed or the frequency of the period switching of the second intermediate signal $S_{l1}$ may be $f_{h2} \cdot r_{LSB2}$ (for example, when F1 is 8.125, it is $f_{h2} \cdot 0.125$), wherein $r_{LSB2}$ is the value corresponding to the least significant bit of the second fractional part $r_l$ of the second frequency control word $F_l$, and $f_{h2}$ is the mean frequency of the second intermediate signal $S_{l1}$. In such a case, the bandwidth of the second filter may be set to be less than or equal to $f_{h2} \cdot r_{LSB2}$, thereby filtering out the high-frequency component of the second intermediate signal $S_{l1}$. Accordingly, the second output signal $S_l$ outputted by the second filter has merely one period.

For example, the parameters of the second filter may be determined according to the mean frequency of the second intermediate signal $S_{l1}$ and the least significant bit of the second fractional part $r_l$ of the second frequency control word $F_l$.

For example, the parameters of the second filter may include the bandwidth of the second filter, and the bandwidth of the second filter may be determined according to Formula (10).

$$\text{Bwlp2} \leq f_{h2} \cdot r_{LSB2} \qquad \text{Formula (10)}$$

In Formula (10), Bwlp2 represents the bandwidth of the second filter, $r_{LSB2}$ represents the value corresponding to the least significant bit of the second fractional part $r_l$ of the second frequency control word $F_l$, $$f_{h2} = \frac{1}{F_l \cdot \Delta}$$

represents the mean frequency of the second intermediate signal $S_{l1}$, and $\Delta$ represents the reference time unit. In other words, it is merely required that the bandwidth of the second filter satisfies Formula (10), and then the second converting sub-circuit 2022 can filter out the high-frequency component of the second intermediate signal $S_{l1}$, to obtain the second output signal $S_l$ comprising merely one period.

For example, the second filter may be implemented as an analog filter or a digital filter. For example, the second filter may be a low-pass filter.

Some embodiments of the first converting sub-circuit 2012 and the second converting sub-circuit 2022 have been described above, but the present disclosure is not limited thereto. In some embodiments, the first converting sub-circuit 2012 may comprise a first phase-locked loop. In such a case, the loop bandwidth of the first phase-locked loop comprised in the first converting sub-circuit 2012 may be determined according to Formula (9). In some embodiments, the second converting sub-circuit 2022 may comprise a second phase-locked loop. In such a case, the loop bandwidth of the second phase-locked loop comprised in the first converting sub-circuit 2012 may be determined according to Formula (10). The exemplary structures of the phase-locked loops according to the embodiments of the present disclosure will be described below with reference to FIG. 11.

By using the first converting sub-circuit 2012 and the second converting sub-circuit 2022, the first intermediate signal $S_{h1}$ and the second intermediate signal $S_{l1}$, which have an extremely small frequency difference, can be converted into the first output signal $S_h$ and the second output signal $S_l$, which have an extremely small periodic inequality. Formula (11) can express the periodic inequality between the period of the first output signal $S_h$ and the period of the second output signal $S_l$.

$$t_R = T_h - T_l = F_h \cdot \Delta - F_l \cdot \Delta = (I_h + r_h) \cdot \Delta - (I_l + r_l) \cdot \Delta = (r_h - r_l) \cdot \Delta \qquad \text{Formula (11)}$$

In Formula (11), $t_R$ represents the periodic inequality between the period of the first output signal $S_h$ and the period of the second output signal $S_l$, $r_h$ represents the first fractional part of the first frequency control word $F_h$, $r_l$ represents the second fractional part of the second frequency control word $F_l$, $I_h$ represents the first integer part of the first frequency control word $F_h$, $I_l$ represents the second integer part of the second frequency control word $F_l$, $I_l = I_h$, and $\Delta$ represents the reference time unit. Referring to the above Formula (7) and Formula (11), the periodic inequality $t_R$ between the period of the first output signal $S_h$ and the period of the second output signal $S_l$ is equal to the periodic inequality $t_R{'}$ between the first average period $T_h$ of the first intermediate signal $S_{h1}$ and the second average period $T_l$ of the second intermediate signal $S_{l1}$.

Figure 6:
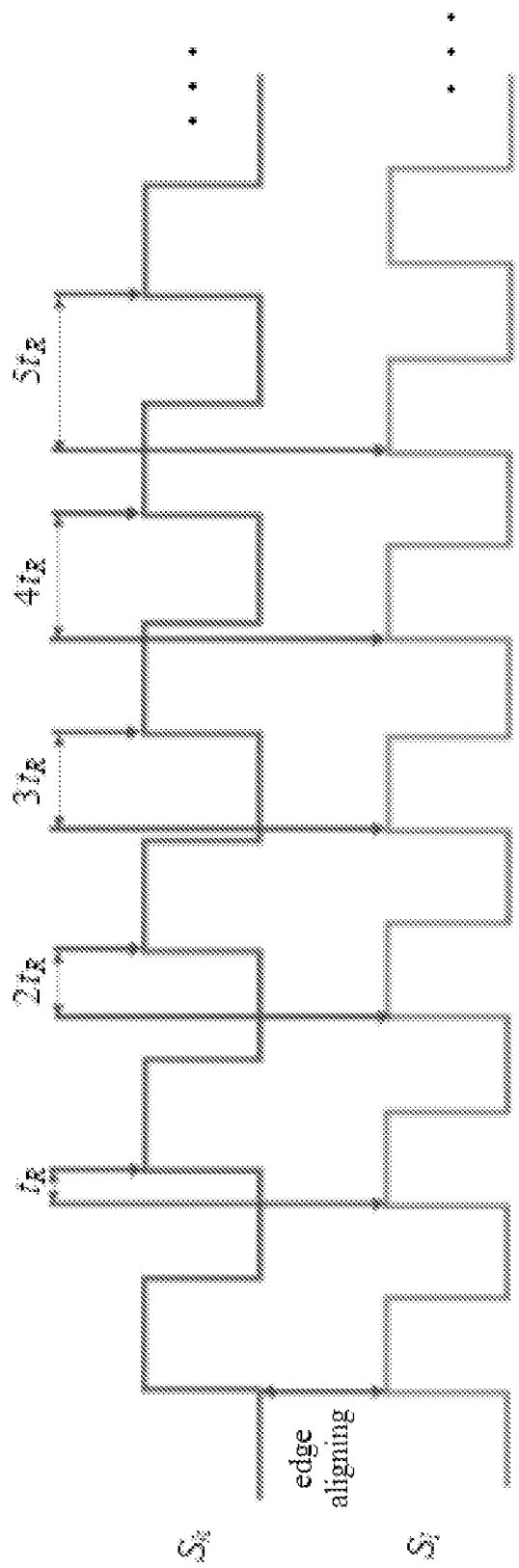
FIG. 6 shows a schematic diagram of the first output signal and the second output signal according to some embodiments of the present disclosure.

FIG. 6 shows a schematic diagram of the first output signal $S_h$ and the second output signal $S_l$ according to an embodiment of the present disclosure.

Referring to FIG. 6, starting from the time moment when the edge of the phase of the first output signal $S_h$ and the edge of the phase of the second output signal $S_l$ are aligned (i.e., phase aligning), after one period has passed, the time difference between the rising edge of the first period $T_1$ of the first output signal $S_h$ and the rising edge of the first period $T_1$ of the second output signal $S_l$ is $t_R$. After two periods have passed, the time difference between the rising edge of the second period $T_2$ of the first output signal $S_h$ and the rising edge of the second period $T_2$ of the second output signal $S_l$ is $2t_R$. Similarly, after five periods have passed, the time difference between the rising edge of the fifth period of the first output signal $S_h$ and the rising edge of the fifth period of the second output signal $S_l$ is $5t_R$. Therefore, starting from the time when the edge of the phase of the first output signal $S_h$ and the edge of the phase of the second output signal $S_l$ are aligned, after m periods have passed, the time difference between the rising edge of the m-th period of the first output signal $S_h$ and the rising edge of the m-th period of the second output signal $S_l$ is $m \cdot t_R$, wherein m is an integer greater than or equal to 1.

In some embodiments, when the reference time unit $\Delta$ is 1 ns and $(r_h - r_l) = 0.000001$, the periodic inequality $t_R$ between the period of the first output signal $S_h$ and the period of the second output signal $S_l$ may be 1 femtosecond (fs), and, accordingly, a signal whose time resolution is of the order of magnitude of femtoseconds may be obtained by using the signal generating electric circuit according to the embodiments of the present disclosure. In an embodiment of the present disclosure, the time resolution may refer to the time difference between the time duration length of the period of the first output signal $S_h$ and the time duration length of the period of the second output signal $S_l$.

In some embodiments, by providing suitable reference time unit $\Delta$, first frequency control word $F_h$ and second frequency control word $F_l$, a signal whose time resolution is of the order of magnitude of picoseconds (ps) may be obtained.

Figure 7:
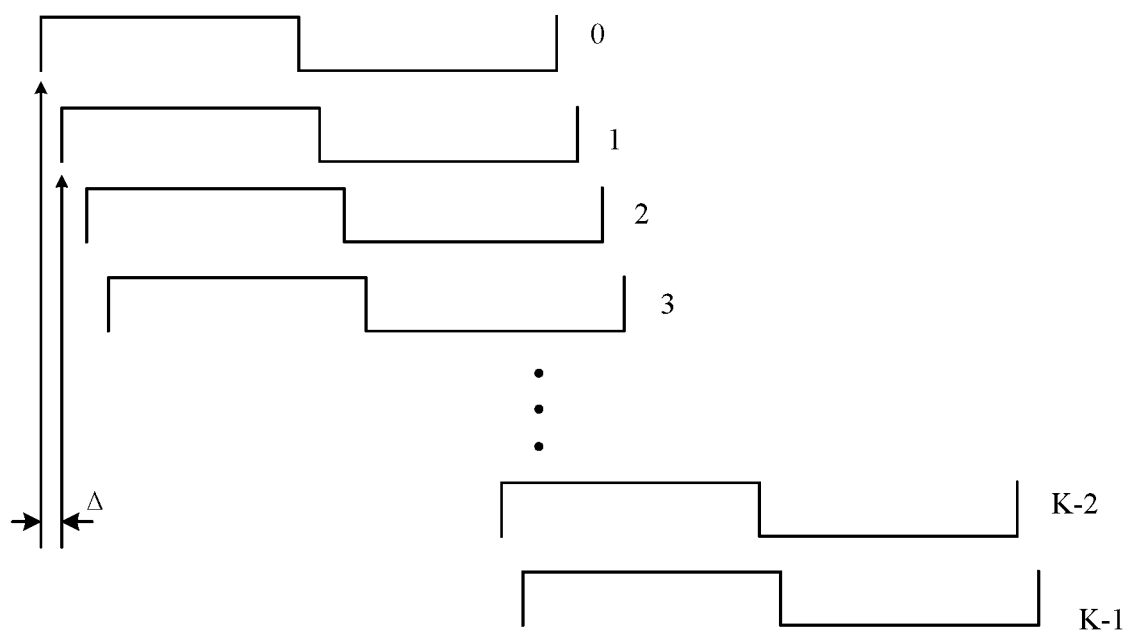
FIG. 7 shows a schematic diagram of the K reference signals whose phases are evenly separated and the reference time unit according to some embodiments of the present disclosure.

FIG. 7 shows a schematic diagram of the reference time unit $\Delta$ according to an embodiment of the present disclosure.

Referring to FIG. 7, the reference time unit $\Delta$ may be the time span (for example, phase difference) between any two neighboring reference signals of K reference signals whose phases are evenly separated, wherein K is a positive integer greater than 1. For example, K=16, 32, 128 or other numerical values. Therefore, the reference time unit $\Delta$ may correspond to K reference signals whose phases are evenly separated.

For example, assuming that all of the frequencies of the K reference signals are $f_{div}$ and all of the periods are $T_{div}$, then the value of the reference time unit $\Delta$ may be expressed by using Formula (12).

$$\Delta = T_{div}/K = 1/(K \cdot f_{div}) \qquad \text{Formula (12)}$$

Figure 8:
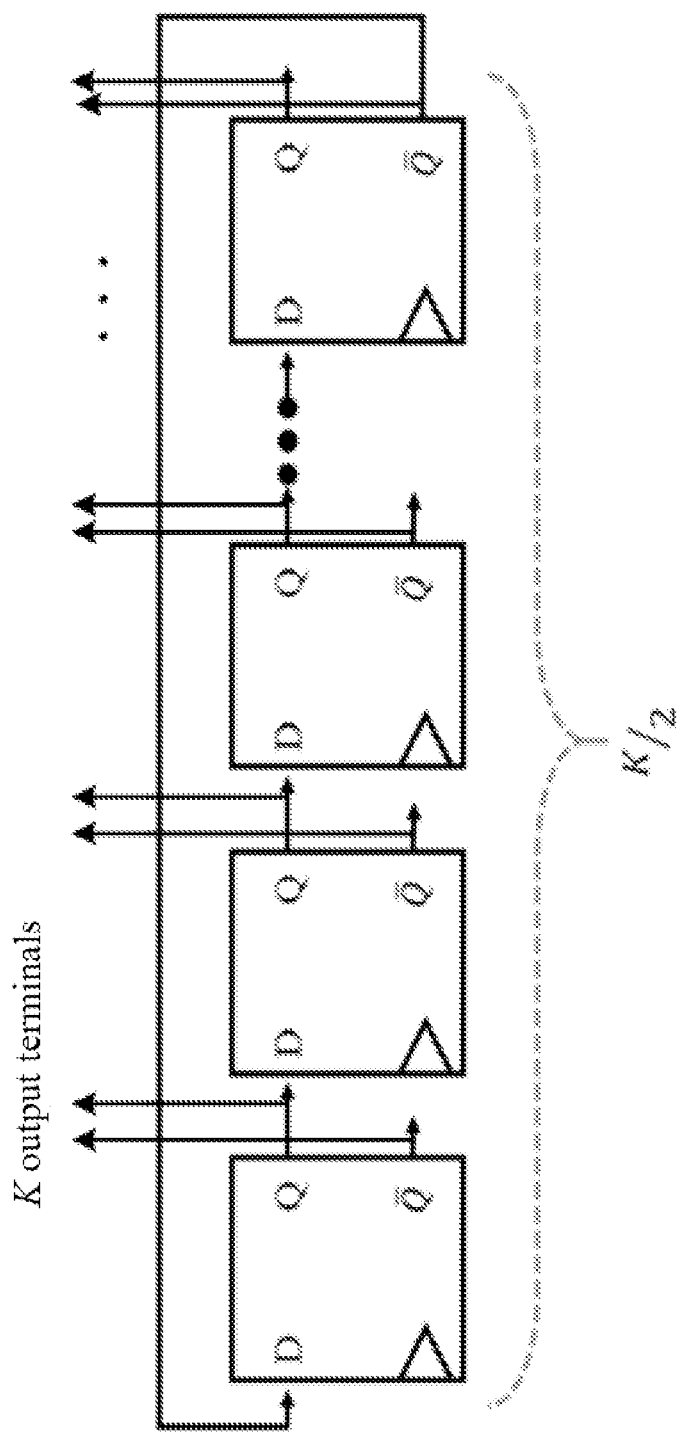
FIG. 8 shows a schematic diagram of the reference-time-unit generating electric circuit according to some embodiments of the present disclosure.

FIG. 8 shows a schematic diagram of the reference-time-unit generating electric circuit according to some embodiments of the present disclosure.

For example, as shown in FIG. 8, the reference-time-unit generating electric circuit may comprise a twisted-ring counter. The twisted-ring counter may comprise a plurality of D triggers. For example, referring to FIG. 8, in order to generate the K reference signals whose phases are evenly separated, the twisted-ring counter may comprise K/2 triggers that are connected in series. For example, the triggers may be D triggers. When the twisted-ring counter comprises K/2 triggers that are connected in series, the digit of the twisted-ring counter is K/2.

Referring to FIG. 8, the output terminals of the triggers of the twisted-ring counter are combined into K output terminals, to output the K reference signals whose phases are evenly separated.

Figure 9:
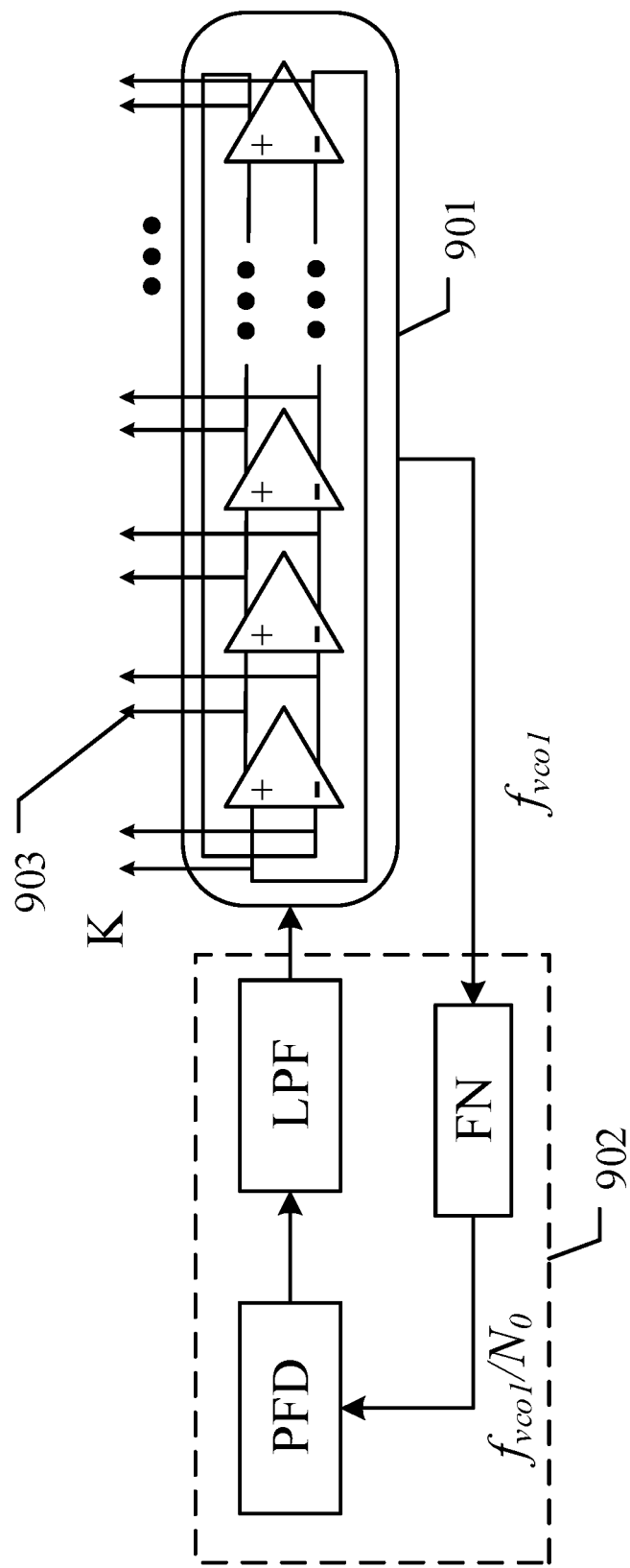
FIG. 9 shows a schematic diagram of another reference-time-unit generating electric circuit according to some embodiments of the present disclosure.

FIG. 9 shows a schematic diagram of another reference-time-unit generating electric circuit according to some embodiments of the present disclosure.

Referring to FIG. 9, the reference-time-unit generating electric circuit may comprise a first voltage-controlled oscillator (VCO) 901, a phase-locked-loop circuit 902 and K output terminals 903. The first voltage-controlled oscillator 901 is configured for oscillating with a preset oscillation frequency. The phase-locked-loop circuit 902 is configured for locking the output frequency of the first voltage-controlled oscillator 901 as the reference output frequency. The K output terminals 903 are configured for outputting the K reference signals whose phases are evenly separated, wherein K is a positive integer greater than 1. For example, K=16, 32, 128 or other numerical values.

For example, as shown in FIG. 9, the phase-locked-loop circuit 902 may comprise a first phase detector (PFD), a first loop filter (LPF) and a first frequency divider (FN).

For example, the first phase detector may be a phase frequency detector.

For example, the first loop filter may be a low-pass filter.

For example, the frequency dividing coefficient of the first frequency divider is No, wherein $N_0$ is a real number, and No is greater than or equal to 1.

For example, in an embodiment of the present disclosure, firstly, a reference signal having the reference frequency may be inputted into the first phase detector, then enter the first loop filter, and then enter the first voltage-controlled oscillator. Finally, the signal having the preset oscillation frequency $f_{vco1}$ generated by the first voltage-controlled oscillator may undergo frequency division by the frequency divider to obtain the crossover frequency $f_{vco1}/N_0$ of the frequency-divided signal. The crossover frequency $f_{vco1}/N_0$ is fed back to the first phase detector. The first phase detector is used for comparing the reference frequency of the reference signal and the crossover frequency $f_{vco1}/N_0$. When the frequency and the phase of the reference frequency are equal to those of the crossover frequency $f_{vco1}/N_0$, the error between them is zero, and, at this point, the phase-locked-loop circuit 902 is in the locked state.

Although exemplary embodiments of the reference-time-unit generating electric circuit have been described above with reference to FIGS. 8 and 9, the embodiments of the present disclosure are not limited thereto. For example, the reference-time-unit generating electric circuit may be implemented by using a Delay-Locked Loop (DLL), or the reference-time-unit generating electric circuit may be implemented by using an LC voltage-controlled oscillator and a differentiator.

Figure 10:
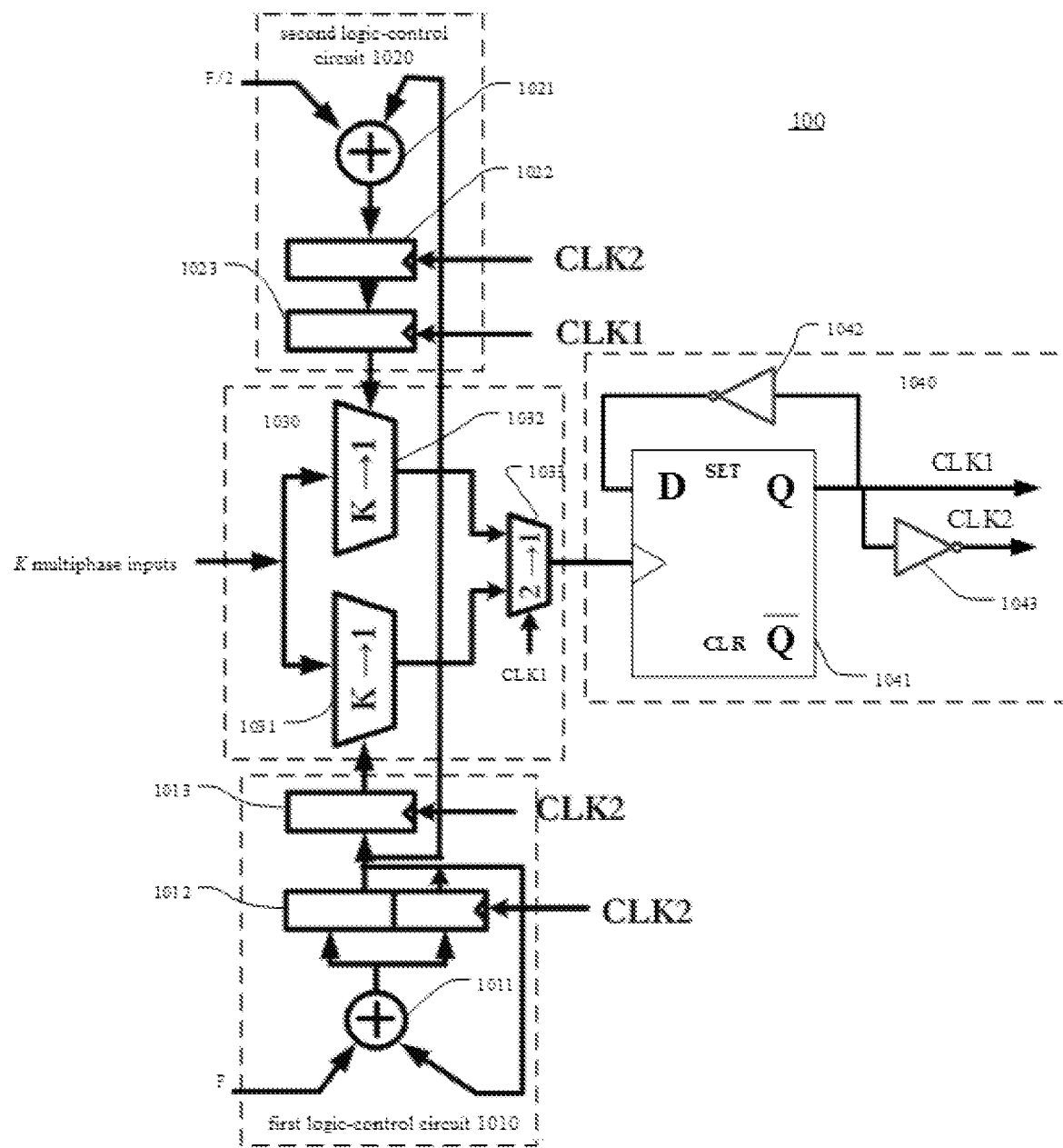
FIG. 10 shows a circuit diagram of the time-average-frequency direct-period synthesizer based on the circuit architecture of Time Average Frequency-Direct Period Synthesis according to some embodiments of the present disclosure.

FIG. 10 shows a circuit diagram of the time-average-frequency direct-period synthesizer based on the TAF-DPS circuit architecture according to some embodiments of the present disclosure. The TAF-DPS circuit architecture in FIG. 10 may be used for generating a synthesized clock signal whose average period is $T_{TAF}$, as shown in Formula (3).

Referring to FIG. 10, the time-average-frequency direct-period synthesizer 100 may comprise a first inputting module, a second inputting module 1030 and an outputting module 1040.

For example, referring to FIG. 10, the first inputting module comprises a first logic-control circuit 1010 and a second logic-control circuit 1020. The first logic-control circuit 1010 comprises a first adder 1011, a first register 1012 and a second register 1013. The second logic-control circuit 1020 may comprise a second adder 1021, a third register 1022 and a fourth register 1023.

For example, referring to FIG. 10, the second inputting module 1030 comprises a first K→1 multiplexer 1031, a second K→1 multiplexer 1032 and a 2→1 multiplexer 1033. The first K→1 multiplexer 1031 and the second K→1 multiplexer 1032 individually comprise a plurality of input terminals for receiving K (K is an integer greater than 1) reference signals whose phases are evenly separated, a controlling input terminal and an output terminal. The 2→0.1 multiplexer 1033 comprises a controlling input terminal, an output terminal, a first input terminal for receiving the output of the first K→1 multiplexer 1031, and a second input terminal for receiving the output of the second K→1 multiplexer 1032. For example, the time span (for example, phase difference) between any two neighboring reference signals of K reference signals whose phases are evenly separated may correspond to the reference time unit Δ.

For example, referring to FIG. 10, the outputting module 1040 comprises a triggering circuit. The triggering circuit is used for generating a pulse train. The triggering circuit comprises a D trigger 1041, a first inverter 1042 and a second inverter 1043. The D trigger 1041 comprises a data input terminal, a clock input terminal for receiving the output of the output terminal of the 2→1 multiplexer 1033, and an output terminal for outputting a first clock signal CLK1. The first inverter 1042 comprises an input terminal for receiving the first clock signal CLK1 and an output terminal for outputting a signal to the data input terminal of the D trigger 1041. The second inverter 1043 comprises an input terminal for receiving the first clock signal CLK1 and an output terminal for outputting a second clock signal CLK2. The output terminal of the triggering circuit or the output terminal of the second inverter 1043 may serve as the output terminal of a TAF-DPS frequency synthesizer.

For example, referring to FIG. 10, the first clock signal CLK1 is outputted to the controlling input terminal of the 2→1 multiplexer 1033, and the output terminal of the first inverter 1042 is connected to the data input terminal of the D trigger 1041.

For example, the first adder 1011 may add the frequency control word F and the most significant bit (for example, 5 bits) stored by the first register 1012, and then store the addition result into the first register 1012 at the rising edge of the second clock signal CLK2. Alternatively, the first adder 1011 may add the frequency control word F and all of the data stored by the first register 1012, and then store the addition result into the first register 1012 at the rising edge of the second clock signal CLK2. At the rising edge of the next second clock signal CLK2, the most significant bit stored by the first register 1012 will be stored into the second register 1013, and serve as a selection signal of the first K→1 multiplexer 1031, for selecting one signal from K multiphase input signals to serve as the output signal of the first K→1 multiplexer 1031.

For example, the second adder 1021 may add the frequency control word F/2 and the most significant bit stored by the third register 1022, and then store the addition result into the third register 1022 at the rising edge of the second clock signal CLK2. At the rising edge of the next first clock signal CLK1, the data stored by the third register 1022 will be stored into the fourth register 1023, and serve as a selection signal of the second K→1 multiplexer, for selecting one signal from K multiphase input signals to serve as the output signal of the second K→1 multiplexer 1023.

For example, the 2→1 multiplexer 1033 may, at the rising edge of the first clock signal CLK1, select one of the output signal from the first K→1 multiplexer 1031 and the output signal from the second K→1 multiplexer 1032 to serve as the output signal of the 2→1 multiplexer 1033, to serve as the input clock signal of the D trigger 1041.

For example, one of the output terminal of the D trigger 1041 and the output terminal of the second inverter 1043 may serve as the output of the time-average-frequency direct-period synthesizer 100. For example, the output of the time-average-frequency direct-period synthesizer of the first generating electric circuit is the first intermediate signal, and the output of the time-average-frequency direct-period synthesizer of the second generating electric circuit is the second intermediate signal.

For example, the selection signal outputted by the second register 1013 may be used for selecting the falling edge of the synthesized clock signal generated by the time-average-frequency direct-period synthesizer 100, the selection signal outputted by the fourth register 1023 may be used for selecting the rising edge of the synthesized clock signal generated by the time-average-frequency direct-period synthesizer 100, and the signal that is fed back from the first register 1012 to the first adder 1011 may be used for controlling the period switching of the synthesized clock generated by the time-average-frequency direct-period synthesizer 100. In order to facilitate the description, the selection signal outputted by the second register 1013 may be referred to as falling-edge control word, the selection signal outputted by the fourth register 1023 may be referred to as rising-edge control word, and the signal that is fed back from the first register 1012 to the first adder 1011 may be referred to as decimal-frequency control word.

It should be noted that, in addition, the operating principle of TAF-DPS may refer to the documents L. XIU, "*Nanometer Frequency Synthesis beyond the Phase-Locked Loop*", Piscataway, N.J. 08854, USA, John Wiley IEEE-press, 2012, and L. XIU, "*From Frequency to Time-Average-Frequency: a Paradigm Shift in the Design of Electronic System*", Piscataway, N.J. 08854, USA, John Wiley IEEE-press, 2015, which are incorporated herein in its entirety by reference.

Figure 11:
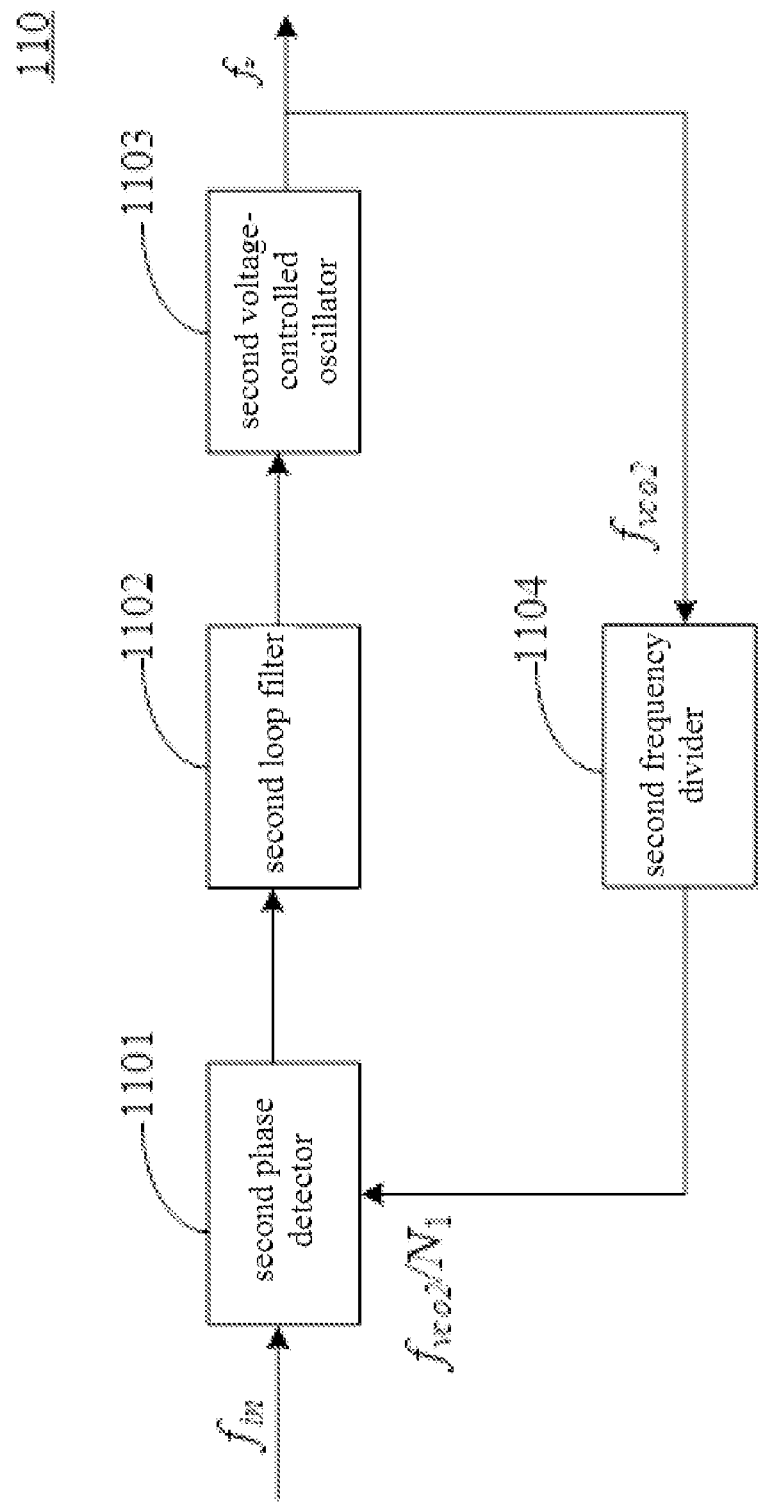
FIG. 11 shows a circuit diagram of the phase-locked loop according to some embodiments of the present disclosure.

FIG. 11 shows a circuit diagram of the phase-locked loop according to some embodiments of the present disclosure.

Referring to FIG. 11, the phase-locked loop 110 may comprise a second phase detector 1101, a second loop filter 1102, a second voltage-controlled oscillator 1103 and a second frequency divider 1104.

For example, the second voltage-controlled oscillator may be configured for, according to a control variable, generating an oscillating signal having a preset oscillation frequency $f_{vco2}$. For example, the second voltage-controlled oscillator may be a digital voltage-controlled oscillator.

For example, the second frequency divider may be configured for performing frequency division to the oscillating signal to obtain a frequency-divided signal having the crossover frequency $f_{vco2}/N_1$. For example, the frequency dividing coefficient of the second frequency divider is $N_1$, wherein $N_1$ is a real number, and $N_1$ is greater than or equal to 1.

For example, the second phase detector may be configured for receiving an input signal, and comparing to obtain the difference between the frequency $f_{in}$ of the input signal and the crossover frequency $f_{vco2}/N_1$ of the frequency-divided signal, to output a difference variable. For example, the second phase detector may be a phase frequency detector.

For example, the second loop filter may be configured for filtering out a high-frequency component of the difference variable, to generate a control variable for controlling the second voltage-controlled oscillator.

For example, the second voltage-controlled oscillator may further be configured for, when the frequency $f_{in}$ of the input signal and the frequency $f_{vco2}/N_1$ of the frequency-divided signal are equal, generating and outputting a target signal having a target frequency $f_o$. When the frequency $f_{in}$ of the input signal and the frequency $f_{vco2}/N_1$ of the frequency-divided signal are equal, the phase-locked loop is in the locked state.

As described above, in some embodiments, the first converting sub-circuit 2012 may comprise a first phase-locked loop. In such a case, the first phase-locked loop may be implemented as the phase-locked loop 110 shown in FIG. 11.

For example, when the first phase-locked loop of the first converting sub-circuit 2012 is implemented as the phase-locked loop 110, the input signal is the first intermediate signal $S_{h1}$, and the target signal is the first output signal $S_h$. In such a case, the bandwidth of the second loop filter 1102 of the phase-locked loop 110 may be determined according to Formula (9).

As described above, in some embodiments, the second converting sub-circuit 2022 may comprise a second phase-locked loop. In such a case, the second phase-locked loop may be implemented as the phase-locked loop 110 shown in FIG. 11.

For example, when the second phase-locked loop of the second converting sub-circuit 2022 is implemented as the phase-locked loop 110, the input signal is the second intermediate signal $S_{l1}$, and the target signal is the second output signal $S_l$. In such a case, the bandwidth of the second loop filter 1102 of the phase-locked loop 110 may be determined according to Formula (10).

Figure 12:
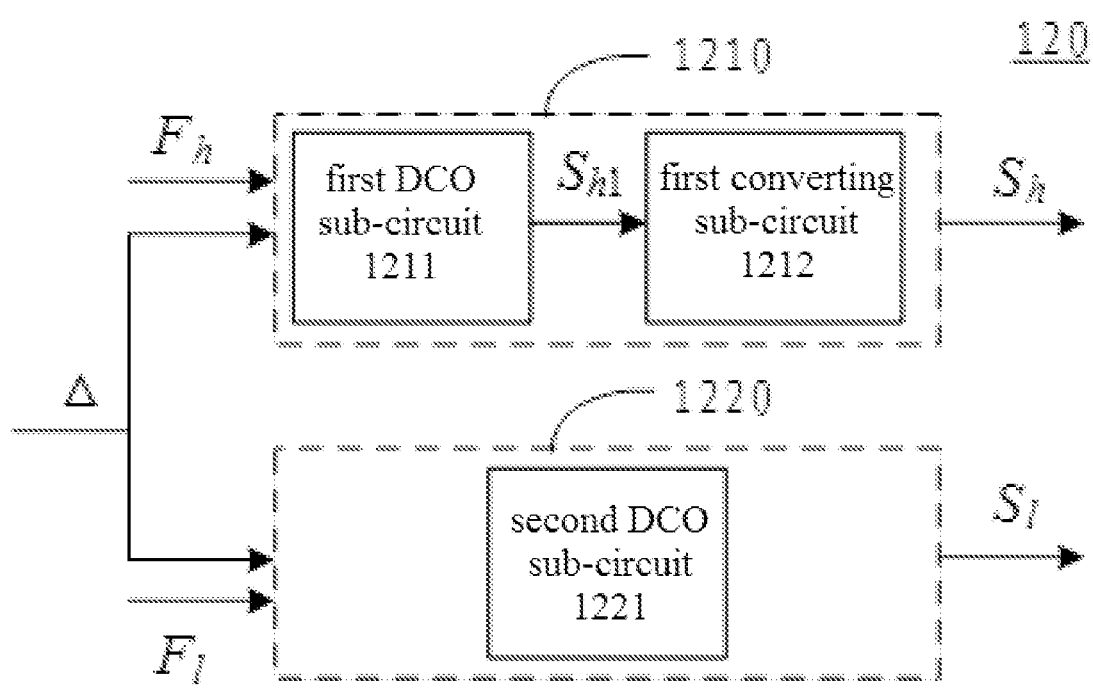
FIG. 12 shows a block diagram of the signal generating electric circuit, when the second frequency control word is an integer, according to some embodiments of the present disclosure.

FIG. 12 shows a block diagram of the signal generating electric circuit when the second frequency control word $F_l$ is an integer according to some embodiments of the present disclosure. In such a case, the first frequency control word $F_h$ may comprise a first integer part and a first fractional part. The second frequency control word $F_l$ comprises a second integer part and a second fractional part. The second fractional part is 0. In other words, the second frequency control word $F_l$ is an integer. The second frequency control word $F_l$ (i.e., the second integer part) is equal to the first integer part of the first frequency control word $F_h$. The first fractional part is not 0. In other words, the first fractional part and the second fractional part are not equal. The period of the first output signal $S_h$ and the period of the second output signal $S_l$ are not equal.

Referring to FIG. 12, the signal generating electric circuit 120 may comprise a first generating electric circuit 1210 and a second generating electric circuit 1220. The first generating electric circuit 1210 may comprise a first Digitally Controlled Oscillator (DCO) sub-circuit 1211 and a first converting sub-circuit 1212. The second generating electric circuit 1220 may comprise a second DCO sub-circuit 1221, and the output of the second DCO sub-circuit 1221 serves as the second output signal $S_l$.

In some embodiments, the periodic inequality between the period of the first output signal $S_h$ and the period of the second output signal $S_l$ is related to the reference time unit $\Delta$ and the first fractional part of the first frequency control word $F_h$.

For example, the first DCO sub-circuit 1211 may be configured for, based on the first frequency control word $F_h$ and the reference time unit $\Delta$, generating the first intermediate signal $S_{h1}$, and the first converting sub-circuit 1212 may be configured for converting the first intermediate signal $S_{h1}$ into the first output signal $S_h$.

For example, the second DCO sub-circuit 1221 may be configured for, based on the second frequency control word $F_l$ and the reference time unit $\Delta$, generating the periodic second output signal $S_l$. Because the second frequency control word $F_l$ is an integer, the second output signal $S_l$ generated by the second DCO sub-circuit 1221 comprises merely one period. For example, the second output signal $S_l$ generated by the second DCO sub-circuit 1221 comprises merely the pulse having the first primitive period $T_A$.

In some embodiments, the first DCO sub-circuit 1211 may be implemented based on the technique of TAF. In such a case, the first intermediate signal $S_{h1}$ generated by the first DCO sub-circuit 1211 is generated by the interlacing between the first primitive period and the second primitive period; in other words, the first intermediate signal $S_{h1}$ is generated by the interlacing between a pulse having the first primitive period and a pulse having the second primitive period. The first average period $T_h$ of the generated first intermediate signal $S_{h1}$ may be expressed by using Formula (4). Exemplary embodiments of implementing the first DCO sub-circuit 1211 based on the technique of TAF may refer to the description above.

In some embodiments, the second DCO sub-circuit 1221 may be implemented based on the technique of TAF. In such a case, because the second frequency control word $F_l$ is an integer (in other words, the second fractional part of the second frequency control word $F_l$ is zero), the second average period $T_l$ of the second output signal $S_l$ is the first primitive period $T_A$. In other words, the second output signal $S_l$ generated by the second DCO sub-circuit 1221 has one period, i.e., the first primitive period $T_A$. Exemplary embodiments of implementing the second DCO sub-circuit 1221 based on the technique of TAF may refer to the description above.

In the embodiments in which the first DCO sub-circuit 1211 and the second DCO sub-circuit 1221 are implemented based on the technique of TAF, the frequency difference between the mean frequency of the first intermediate signal $S_{h1}$ and the mean frequency of the second output signal $S_l$ may be expressed by using Formula (13). In addition, the periodic inequality between the first average period $T_h$ of the first intermediate signal $S_{h1}$ and the average period of the second output signal $S_l$ may be expressed by using Formula (14).

$$f_R = \frac{1}{T_l} - \frac{1}{T_h} = \quad \quad \text{Formula (13)}$$
$$\frac{1}{F_l \cdot \Delta} - \frac{1}{F_h \cdot \Delta} = \frac{1}{I_l \cdot \Delta} - \frac{1}{(I_h + r_h) \cdot \Delta} = \frac{r_h}{I(I_h + r_h) \cdot \Delta}$$

$$t_R' = T_h - T_l = F_h \cdot \Delta - F_l \cdot \Delta = (I_h + r_h) \cdot \Delta - I_l \cdot \Delta = r_h \cdot \Delta \quad \text{Formula (14)}$$

In Formula (13) and Formula (14), $f_R$ represents the frequency difference between the mean frequency of the first intermediate signal $S_{h1}$ and the mean frequency of the second output signal $S_l$, $t_R'$ represents the periodic inequality between the first average period $T_h$ of the first intermediate signal $S_{h1}$ and the average period of the second output signal $S_l$, $r_h$ represents the first fractional part of the first frequency control word $F_h$, $I_h$ represents the first integer part of the first frequency control word $F_h$, $I_l$ represents the second integer part of the second frequency control word $F_l$, $I_l = I_h$, $\Delta$ represents the reference time unit, and the second fractional part of the second frequency control word $F_l$ is zero. The frequency difference between the mean frequency of the first intermediate signal $S_{h1}$ and the mean frequency of the second output signal $S_l$ may be determined according to the first fractional part of the first frequency control word $F_h$, and when the value of the first fractional part is very small, the frequency difference between the mean frequency of the first intermediate signal $S_{h1}$ and the mean frequency of the second output signal $S_l$ is also very small. For example, when the first fractional part of the first frequency control word $F_h$ is very small, by using the first DCO sub-circuit 1211 and the second DCO sub-circuit 1221, the first intermediate signal $S_{h1}$ and the second output signal $S_l$ having a very small frequency difference may be obtained. In addition, because all of the periods of the first intermediate signal $S_{h1}$ are not equal to $T_h$, Formula (14) merely represents the periodic inequality between the first average period of the first intermediate signal $S_{h1}$ and the average period of the second output signal $S_l$. For example, the first average period $T_h$ of the first intermediate signal $S_{h1}$ is obtained by the averaging of $2^{u1}$ periods, wherein $u_1 = -\log_2 r_{LSB1}$, and $r_{LSB1}$ is the value corresponding to the least significant bit of the first fractional part $r_h$ of the first frequency control word $F_h$.

In some embodiments, the first converting sub-circuit 1212 may be configured for converting the first intermediate signal $S_{h1}$ into the first output signal $S_h$ having one period (i.e., the first average period).

In some embodiments, the first converting sub-circuit 1212 may comprise a first filter, and the first filter may be configured for filtering out a high-frequency component of the first intermediate signal $S_{h1}$ to obtain the first output signal $S_h$. Depending on the configuration of the first DCO sub-circuit 1211, the first intermediate signal $S_{h1}$ outputted by the first DCO sub-circuit 1211 comprises a high-frequency component and a low-frequency component. By filtering out the high-frequency component of the first intermediate signal $S_{h1}$, the first output signal $S_h$ comprising merely one period may be obtained. In some embodiments, the high-frequency component and the low-frequency component of the first intermediate signal $S_{h1}$ may be related to the speed or the frequency of the period switching of the first intermediate signal $S_{h1}$. As described above, the first intermediate signal $S_{h1}$ outputted by the first DCO sub-circuit 1212 may comprise two periods: the first primitive period $T_A$ and the second primitive period $T_B$, so the "period switching" according to some embodiments of the present disclosure may refer to the switching from the first primitive period $T_A$ to the second primitive period $T_B$ or from the second primitive period $T_B$ to the first primitive period $T_A$. For example, regarding the first intermediate signal $S_{h1}$, the frequency component whose frequency is greater than the minimum value of the speed or the frequency of the period switching of the first intermediate signal $S_{h1}$ is the high-frequency component of the first intermediate signal $S_{h1}$, and the frequency component whose frequency is less than or equal to the minimum value of the speed or the frequency of the period switching of the first intermediate signal $S_{h1}$ is the low-frequency component of the first intermediate signal $S_{h1}$. For example, the minimum value of the speed or the frequency of the period switching of the first intermediate signal $S_{h1}$ may be $f_{h1} \cdot r_{LSB}$ (for example, when $F_h$ is 8.125, it is $f_{h1} \cdot 0.125$), wherein $r_{LSB1}$ is the value corresponding to the least significant bit of the first fractional part $r_h$ of the first frequency control word $F_h$, and $f_{h1}$ is the mean frequency of the first intermediate signal $S_{h1}$. In such a case, the bandwidth of the first filter may be set to be less than or equal to $f_{h1} \cdot r_{LSB}$, thereby filtering out the high-frequency component of the first intermediate signal $S_{h1}$. Accordingly, the first output signal $S_h$ outputted by the first filter has merely one period.

For example, the parameters of the first filter may be determined according to the mean frequency of the first intermediate signal $S_{h1}$ and the least significant bit of the first fractional part.

For example, the parameters of the first filter may include the bandwidth of the first filter, and the bandwidth of the first filter may be determined according to Formula (9).

For example, the first filter may be implemented as an analog filter or a digital filter. For example, the first filter may be a low-pass filter.

In some embodiments, the first converting sub-circuit 1212 may comprise a first phase-locked loop. In such a case, the loop bandwidth of the first phase-locked loop comprised in the first converting sub-circuit 1212 may be determined according to Formula (9). For example, the first phase-locked loop may be implemented as the phase-locked loop 110 shown in FIG. 11.

By using the first converting sub-circuit 1212, the first intermediate signal $S_{h1}$ and the second output signal $S_l$, which have an extremely small frequency difference, can be converted into the first output signal $S_h$ and the second output signal $S_l$, which have an extremely small periodic inequality. Formula (15) can express the periodic inequality between the period of the first output signal $S_h$ and the period of the second output signal $S_l$.

$$t_R = T_h - T_l = F_h \cdot \Delta - F_l \cdot \Delta = (I_h + r_h) \cdot \Delta - I_l \cdot \Delta = r_h \cdot \Delta \qquad \text{Formula (15)}$$

In Formula (15), $t_R$ represents the periodic inequality between the period of the first output signal $S_h$ and the period of the second output signal $S_l$, $r_h$ represents the first fractional part of the first frequency control word $F_h$, $I_h$ represents the first integer part of the first frequency control word $F_h$, $I_l$ represents the second integer part of the second frequency control word $F_l$, $I_l = I_h$, $\Delta$ represents the reference time unit, and the second fractional part of the second frequency control word $F_l$ is zero. Referring to the above Formula (14) and Formula (15), the periodic inequality $t_R$ between the period of the first output signal $S_h$ and the period of the second output signal $S_l$ is equal to the periodic inequality $t_R'$ between the first average period $T_h$ of the first intermediate signal $S_{h1}$ and the average period of the second output signal $S_l$.

In some embodiments, starting from the time moment when the phases of the first output signal $S_h$ and the second output signal $S_l$ are aligned, after m periods have passed, the time difference between the rising edge of the m-th period of the first output signal $S_h$ and the rising edge of the m-th period of the second output signal $S_l$ is $m \cdot t_R$, wherein m is an integer greater than or equal to 1.

In some embodiments, when the reference time unit $\Delta$ is 1 ns and $r_h = 0.000001$, the periodic inequality $t_R$ between the period of the first output signal $S_h$ and the period of the second output signal $S_l$ may be 1 fs, and, accordingly, a signal whose time resolution is of the order of magnitude of femtoseconds may be obtained by using the signal generating electric circuit according to the embodiments of the present disclosure. In an embodiment of the present disclosure, the time resolution may refer to the time difference between the time duration length of the period of the first output signal $S_h$ and the time duration length of the period of the second output signal $S_l$.

In some embodiments, by providing suitable reference time unit $\Delta$ and first frequency control word $F_h$, a signal whose time resolution is of the order of magnitude of picoseconds (ps) may be obtained.

Figure 13A:
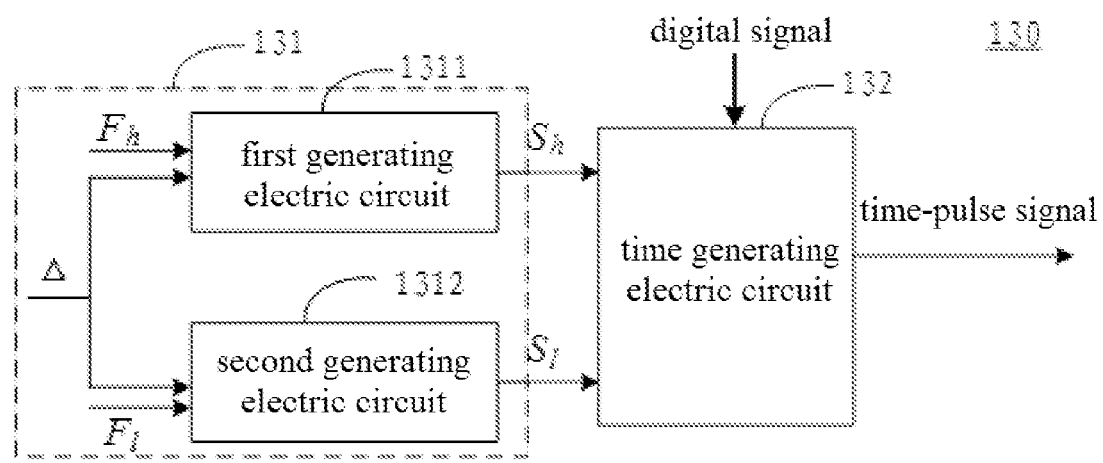
FIG. 13A shows a block diagram of the digit-to-time converting electric circuit according to some embodiments of the present disclosure.

At least an embodiment of the present disclosure further provides a digit-to-time converting electric circuit. FIG. 13A shows a block diagram of the digit-to-time converting electric circuit according to at least an embodiment of the present disclosure.

Referring to FIG. 13A, the digit-to-time converting electric circuit 130 may comprise a signal generating electric circuit 131 and a time generating electric circuit 132. The signal generating electric circuit 131 may comprise a first generating electric circuit 1311 and a second generating electric circuit 1312. The first generating electric circuit 1311 may be configured for, based on a first frequency control word $F_h$ and a reference time unit $\Delta$, generating the periodic first output signal $S_h$. The second generating electric circuit 1312 may be configured for, based on the second frequency control word $F_l$ and the reference time unit $\Delta$, generating the periodic second output signal $S_l$. For example, the signal generating electric circuit 131 may be implemented according to the signal generating electric circuit according to any one of the above embodiments. The time generating electric circuit 132 may be configured for receiving a digital signal, the first output signal $S_h$ and the second output signal $S_l$, and, based on the digital signal, the first output signal $S_h$ and the second output signal $S_l$, generating a first time-pulse signal or a second time-pulse signal corresponding to the digital signal. For example, the time generating electric circuit 132 may be configured for, based on the digital signal and the periodic inequality between the period of the first output signal $S_h$ and the period of the second output signal $S_l$, generating the first time-pulse signal or the second time-pulse signal.

In some embodiments, the digital signal may have n bits that are expressed as <n−1:0>, wherein n may represent the bit width of the digital signal, and n is an integer greater than or equal to 1. For example, the time generating electric circuit 132 may be configured for, based on the bit width of the digital signal and the periodic inequality between the period of the first output signal $S_h$ and the period of the second output signal $S_l$, generating the first time-pulse signal or the second time-pulse signal corresponding to the digital signal.

Figure 13B:
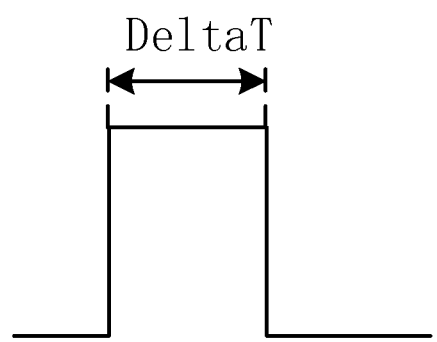
FIG. 13B shows a schematic diagram of the first time-pulse signal according to some embodiments of the present disclosure.

In some embodiments, as shown in FIG. 13B, the first time-pulse signal may be a single one signal. In such a case, a first minimum time interval between the rising edge and the falling edge of the first time-pulse signal is related to the periodic inequality between the period of the first output signal $S_h$ and the period of the second output signal $S_l$. Here, the first minimum time interval refers to the minimum time interval between the rising edge and the falling edge of the first time-pulse signal, and the first minimum time interval may refer to the time interval between the rising edge and the falling edge of the first time-pulse signal within one period; in other words, the first minimum time interval may refer to the pulse width of a single one pulse of the first time-pulse signal.

Figure 13C:
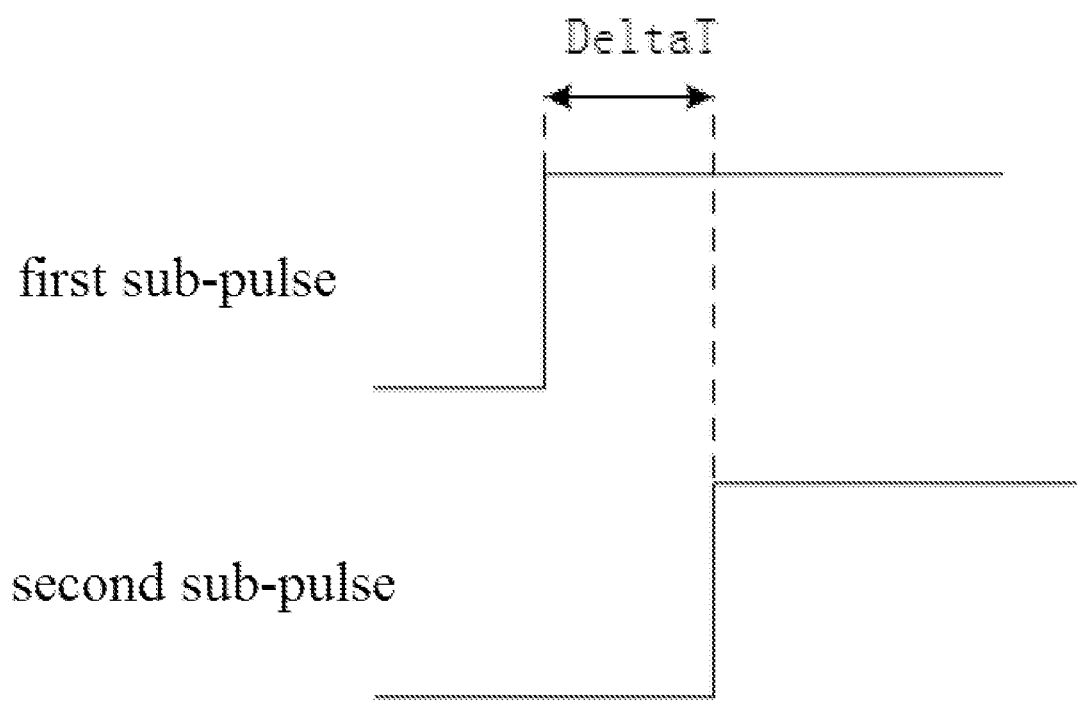
FIG. 13C shows a schematic diagram of the second time-pulse signal according to some embodiments of the present disclosure.

In some embodiments, as shown in FIG. 13C, the second time-pulse signal may comprise a first sub-pulse signal and a second sub-pulse signal. In such a case, the second minimum time interval between the rising edge of the first sub-pulse signal and the rising edge of the second sub-pulse signal is related to the reference time unit and the periodic inequality between the period of the first output signal $S_h$ and the period of the second output signal $S_l$. Here, the second minimum time interval refers to the minimum time interval between the rising edge of the first sub-pulse signal and the rising edge of the second sub-pulse signal; for example, the second minimum time interval may refer to the time interval between the first rising edge of the first sub-pulse signal and the corresponding first rising edge of the second sub-pulse signal. For example, the first sub-pulse signal may comprise merely a single one rising edge, the second sub-pulse signal may comprise merely a single one rising edge, the second minimum time interval may refer to the time interval between the rising edge of the first sub-pulse signal and the rising edge of the second sub-pulse signal.

For example, the first minimum time interval and the second minimum time interval may be equal.

For example, the first minimum time interval or the second minimum time interval may be expressed by using Formula (16).

$$\text{Delta}T = n \cdot t_R \qquad \text{Formula (16)}$$

In Formula (16), DeltaT represents the first minimum time interval or the second minimum time interval, n represents the value corresponding to the digital signal (for example, the bit width of the digital signal), and $t_R$ represents the periodic inequality between the period of the first output signal $S_h$ and the period of the second output signal $S_l$. For example, $t_R$ may represent the minimum time resolution of the digit-to-time convertor, i.e., the duration corresponding to the least significant bit (LSB) of the digital signal. If $t_R$ is smaller, the duration precision (i.e., the time resolution) is higher, and if n is greater, the covered range (measurement range) is larger.

Depending on the mode of the implementation of the signal generating electric circuit 131, the periodic inequality between the period of the first output signal $S_h$ and the period of the second output signal $S_l$ may be expressed by using Formula (11) or Formula (15). In addition, in some embodiments, as described above, starting from the time moment when the phases of the first output signal $S_h$ and the second output signal $S_l$ are aligned, after m periods have passed, the time difference between the rising edge of the m-th period of the first output signal $S_h$ and the rising edge of the m-th period of the second output signal $S_l$ is $m \cdot t_R$, wherein m is an integer greater than or equal to 1. Therefore, the time difference between the rising edge of the m-th period of the first output signal $S_h$ and the rising edge of the m-th period of the second output signal $S_l$ may serve as $m \cdot t_R$, to generate the first time-pulse signal or generate the second time-pulse signal comprising the first sub-pulse signal and the second sub-pulse signal.

In an example, the time generating electric circuit 132 may comprise a first counter, a second counter and a decoder. The first counter may be configured for, by starting from the time moment when the phases of the first output signal $S_h$ and the second output signal $S_l$ are aligned, counting the periods of the first output signal $S_h$. The second counter may be configured for, by starting from the time moment when the phases of the first output signal $S_h$ and the second output signal $S_l$ are aligned, counting the periods of the second output signal $S_l$. The decoder may be configured for, when the period quantity of the first output signal $S_h$ is equal to a value corresponding to the digital signal (for example, the bit width n of the digital signal), at the time moment corresponding to the rising edge of the n-th period of the first output signal $S_h$, setting the first time-pulse signal to be 1, and, when the period quantity of the second output signal $S_l$ is equal to a value corresponding to the digital signal (for example, the bit width n of the digital signal), at the time moment corresponding to the rising edge of the n-th period of the second output signal $S_l$, setting the first time-pulse signal to be 0. Accordingly, the first time-pulse signal whose pulse width is DeltaT can be generated. Alternatively, the decoder may be configured for, when the period quantity of the first output signal $S_h$ is equal to a value corresponding to the digital signal (for example, the bit width n of the digital signal), at the time moment corresponding to the rising edge of the n-th period of the first output signal $S_h$, setting the first sub-pulse signal of the second time-pulse signal to be 1, and, when the period quantity of the second output signal $S_l$ is equal to a value corresponding to the digital signal (for example, the bit width n of the digital signal), at the time moment corresponding to the rising edge of the n-th period of the second output signal $S_l$, setting the second sub-pulse signal of the second time-pulse signal to be 1. Accordingly, the second time-pulse signal comprising the first sub-pulse signal and the second sub-pulse signal can be generated, and the second minimum time interval corresponding to the first sub-pulse signal and the second sub-pulse signal is DeltaT.

In some embodiments, because the periodic inequality between the period of the first output signal $S_h$ and the period of the second output signal $S_l$ is of the order of magnitude of femtoseconds or picoseconds, the first time-pulse signal whose pulse width is of the order of magnitude of femtoseconds or picoseconds can be generated, or the second time-pulse signal comprising the first sub-pulse signal and the second sub-pulse signal whose time interval is of the order of magnitude of femtoseconds or picoseconds can be generated.

In some embodiments, in order to determine the time moment when the phase of the first output signal $S_h$ and the phase of the second output signal $S_l$ are aligned, the digit-to-time converting electric circuit 130 may further comprise a phase-detector circuit. The phase-detector circuit may be configured for determining the phase relation between the first output signal $S_h$ and the second output signal $S_l$, to generate an indicator signal indicating that the phase of the first output signal $S_h$ and the phase of the second output signal $S_l$ are aligned. In such a case, the time generating electric circuit 132 may be configured for, based on the digital signal, the first output signal $S_h$, the second output signal $S_l$ and the indicator signal, generating the first time-pulse signal or the second time-pulse signal. Some embodiments of the digit-to-time converting electric circuit comprising the phase-detector circuit will be described below.

Figure 14A:
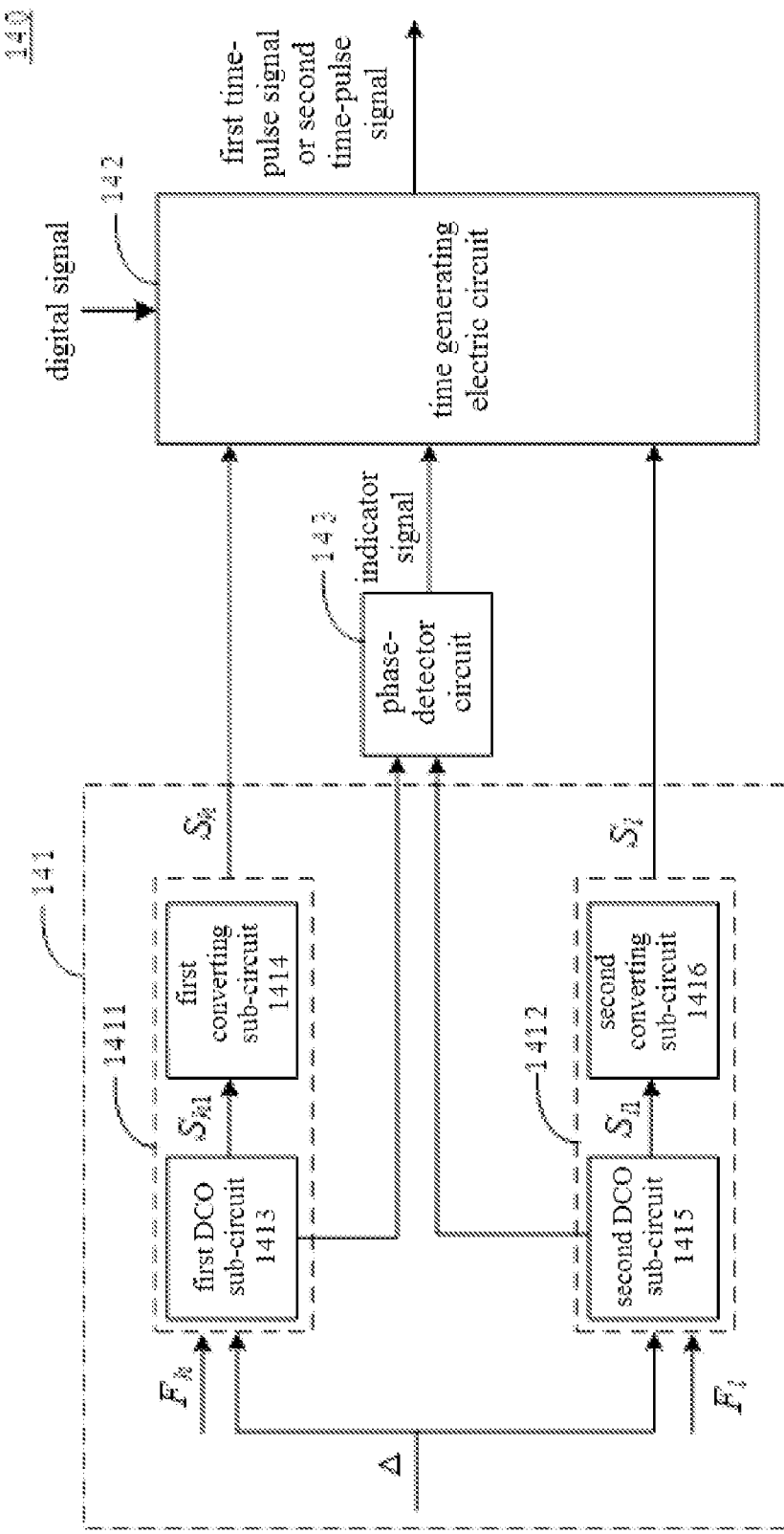
FIG. 14A shows a block diagram of the digit-to-time converting electric circuit according to some embodiments of the present disclosure.

FIG. 14A shows a block diagram of the digit-to-time converting electric circuit according to some embodiments of the present disclosure.

Referring to FIG. 14A, the digit-to-time converting electric circuit 140 may comprise a signal generating electric circuit 141, a time generating electric circuit 142 and a phase-detector circuit 143. The signal generating electric circuit 141 may comprise a first generating electric circuit 1411 and a second generating electric circuit 1412. The first generating electric circuit 1411 may be configured for, based on a first frequency control word $F_h$ and a reference time unit Δ, generating a periodic first output signal $S_h$. The second generating electric circuit 1412 may be configured for, based on the second frequency control word $F_l$ and the reference time unit Δ, generating the periodic second output signal $S_l$. The time generating electric circuit 142 may be configured for receiving the digital signal, the first output signal $S_h$ and the second output signal Si, and, based on the digital signal, the first output signal $S_h$ and the second output signal $S_l$, generating a first time-pulse signal or a second time-pulse signal corresponding to the digital signal.

The signal generating electric circuit 141 may be implemented by using the signal generating electric circuit according to some embodiments illustrated in FIG. 2. The signal generating electric circuit 141 may comprise a first generating electric circuit 1411 and a second generating electric circuit 1412. The first generating electric circuit 1411 may comprise a first DCO sub-circuit 1413 and a first converting sub-circuit 1414. The second generating electric circuit 1412 may comprise a second DCO sub-circuit 1415 and a second converting sub-circuit 1416.

For example, the first DCO sub-circuit 1413 may be configured for, based on a first frequency control word $F_h$ and a reference time unit Δ, generating a first intermediate signal $S_{h1}$; and when generating the first intermediate signal $S_{h1}$, outputting a first rising-edge control word corresponding to the rising edge of the first intermediate signal $S_{h1}$, a first falling-edge control word corresponding to the falling edge of the first intermediate signal $S_{h1}$ and a first decimal-frequency control word corresponding to the period switching of the first intermediate signal $S_{h1}$. The first converting sub-circuit 1414 may be configured for converting the first intermediate signal $S_{h1}$ into the first output signal $S_h$. In an embodiment in which the first DCO sub-circuit comprises the time-average-frequency direct-period synthesizer illustrated in FIG. 10, the first falling-edge control word corresponds to the selection signal outputted by the second register 1013 of the first DCO sub-circuit, the first rising-edge control word corresponds to the selection signal outputted by the fourth register 1023 of the first DCO sub-circuit, and the first decimal-frequency control word corresponds to the signal that is fed back from the first register 1012 of the first DCO sub-circuit to the first adder 1011.

For example, the second DCO sub-circuit 1415 may be configured for, based on a second frequency control word $F_l$ and the reference time unit Δ, generating a second intermediate signal $S_{l1}$; and when generating the second intermediate signal $S_{l1}$, outputting a second rising-edge control word corresponding to the rising edge of the second intermediate signal $S_{l1}$, a second falling-edge control word corresponding to the falling edge of the second intermediate signal $S_{l1}$ and a second decimal-frequency control word corresponding to the period switching of the second intermediate signal $S_{l1}$. The second converting sub-circuit may be configured for converting the second intermediate signal $S_{l1}$ into the second output signal. In an embodiment in which the second DCO sub-circuit comprises the time-average-frequency direct-period synthesizer illustrated in FIG. 10, the second falling-edge control word corresponds to the selection signal outputted by the second register 1013 of the second DCO sub-circuit, the second rising-edge control word corresponds to the selection signal outputted by the fourth register 1023 of the second DCO sub-circuit, and the second decimal-frequency control word corresponds to the signal that is fed back from the first register 1012 of the second DCO sub-circuit to the first adder 1011.

For example, in the present example, the first frequency control word $F_h$ may comprise a first integer part and a first fractional part, the second frequency control word $F_l$ may comprise a second integer part and a second fractional part, the first integer part and the second integer part are equal, and the first fractional part and the second fractional part are not equal. For example, both of the first fractional part and the second fractional part may be not equal to 0.

For example, the phase-detector circuit 143 may be configured for, based on the first rising-edge control word, the second rising-edge control word, the first falling-edge control word, the second falling-edge control word, the first decimal-frequency control word and the second decimal-frequency control word, generating an indicator signal indicating that the phase of the first output signal $S_h$ and the phase of the second output signal $S_l$ are aligned. Because metastable state appears when the phase difference between the phase of the first output signal $S_h$ and the phase of the second output signal $S_l$ is extremely small, it is very difficult to directly compare the first output signal $S_h$ and the second output signal $S_l$. By using the first rising-edge control word, the first falling-edge control word and the first decimal-frequency control word, which are outputted by the first DCO sub-circuit, and the second rising-edge control word, the second falling-edge control word and the second decimal-frequency control word, which are outputted by the second DCO sub-circuit, the phase relation between the first output signal $S_h$ and the second output signal $S_l$ may be obtained, whereby, when the phase difference between the phase of the first output signal $S_h$ and the phase of the second output signal $S_l$ is very small, the phase comparison can still be performed. An example of the phase-detector circuit 143 will be described below with reference to FIG. 14B.

Figure 14B:
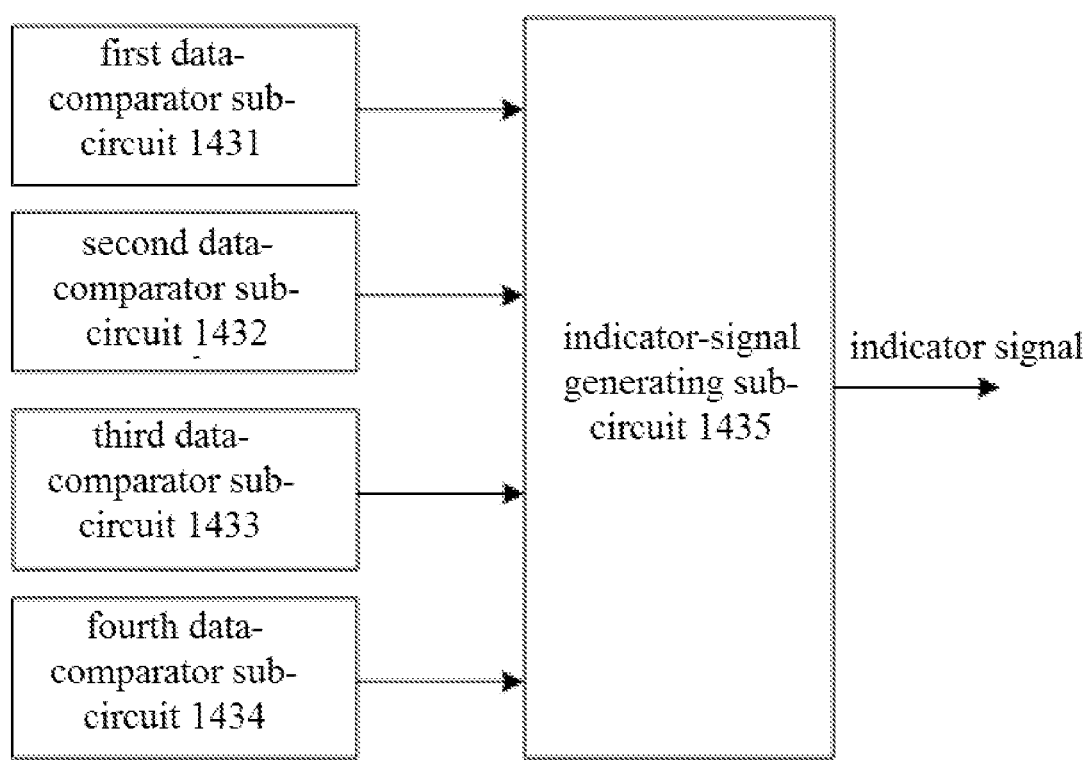
FIG. 14B shows an example of the phase-detector circuit in FIG. 14A.

FIG. 14B shows a schematic diagram of the phase-detector circuit 143 according to some embodiments of the present disclosure.

Referring to FIG. 14B, the phase-detector circuit 143 may comprise a first data-comparator sub-circuit 1431, a second data-comparator sub-circuit 1432, a third data-comparator sub-circuit 1433, a fourth data-comparator sub-circuit 1434 and an indicator-signal generating sub-circuit 1435. The first data-comparator sub-circuit 1431 may be configured for comparing the first rising-edge control word and the second rising-edge control word and outputting a first comparison result. The second data-comparator sub-circuit 1432 may be configured for comparing the first falling-edge control word and the second falling-edge control word and outputting a second comparison result. The third data-comparator sub-circuit 1433 may be configured for comparing the first decimal-frequency control word and zero and outputting a third comparison result. The fourth data-comparator sub-circuit 1434 may be configured for comparing the second decimal-frequency control word and zero and outputting a fourth comparison result. The indicator-signal generating sub-circuit 1435 may be configured for, when the first comparison result indicates that the first rising-edge control word and the second rising-edge control word are equal, the second comparison result indicates that the first falling-edge control word and the second falling-edge control word are equal, the third comparison result indicates that the first decimal-frequency control word is equal to zero and the fourth comparison result indicates that the second decimal-frequency control word is equal to zero, outputting an indicator signal indicating that the phase of the first output signal $S_h$ and the phase of the second output signal $S_l$ are aligned; and, in other cases (for example, when the first comparison result indicates that the first rising-edge control word and the second rising-edge control word are not equal, or the second comparison result indicates that the first falling-edge control word and the second falling-edge control word are not equal, or the third comparison result indicates that the first decimal-frequency control word is not equal to zero, or the fourth comparison result indicates that the second decimal-frequency control word is not equal to zero), not outputting a signal or outputting a signal indicating that the phase of the first output signal $S_h$ and the phase of the second output signal $S_l$ are not aligned.

For example, the first data-comparator sub-circuit 1431, the second data-comparator sub-circuit 1432, the third data-comparator sub-circuit 1433, the fourth data-comparator sub-circuit 1434 and the indicator-signal generating sub-circuit 1435 may be implemented by using combinational logic circuit.

Figure 14C:
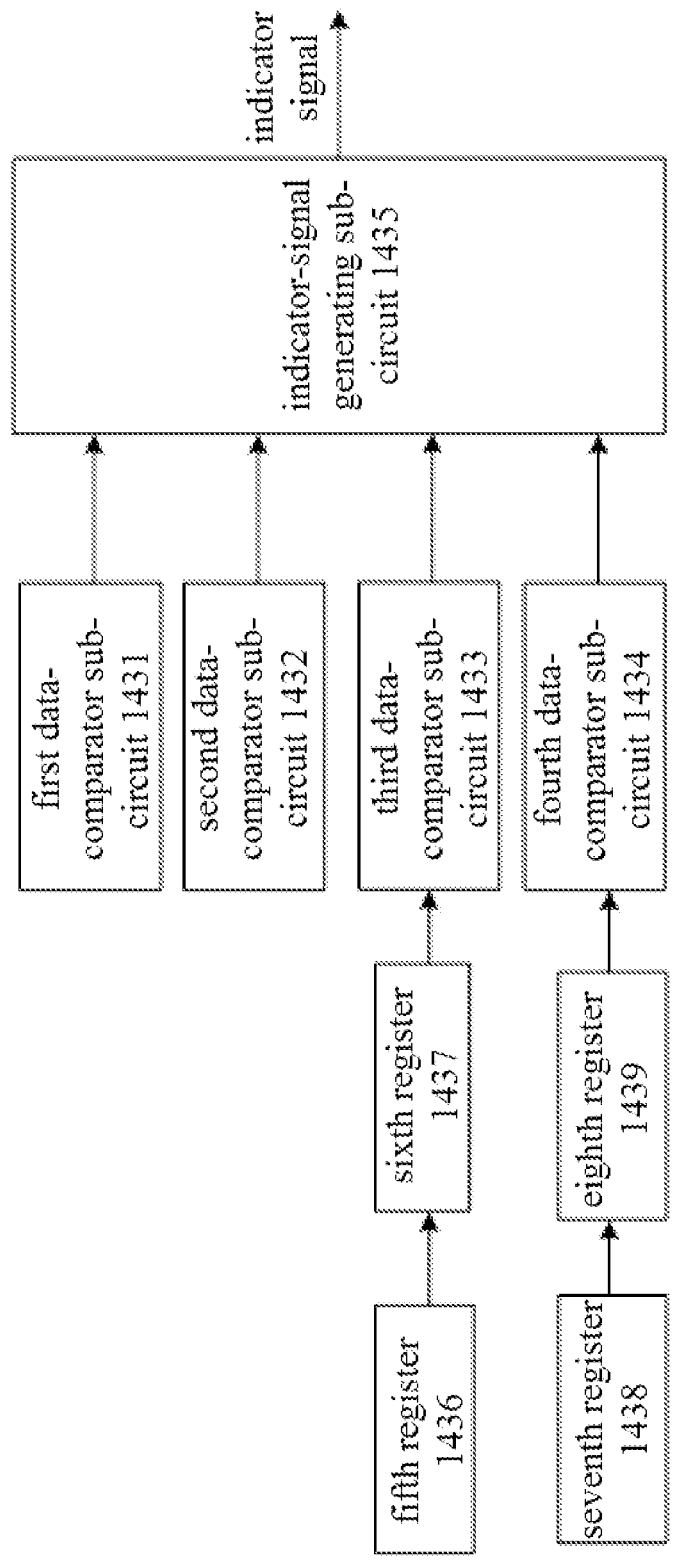
FIG. 14C shows another example of the phase-detector circuit in FIG. 14A.

In an example, referring to FIG. 14C, in an embodiment in which both of the first DCO sub-circuit and the second DCO sub-circuit comprise the time-average-frequency direct-period synthesizer illustrated in FIG. 10, the phase-detector circuit 143 may further comprise a fifth register 1436 and a sixth register 1437 that are connected in series, and a seventh register 1438 and an eighth register 1439 that are connected in series. Referring to FIG. 10, the falling-edge control word outputted by the second register 1013 passes through the first register 1012 and the second register 1013, and the rising-edge control word outputted by the fourth register 1023 passes through the third register 1022 and the fourth register 1023. Therefore, in order to enable the first decimal-frequency control word, the rising-edge control word and the falling-edge control word outputted by the first DCO sub-circuit to maintain synchronous, the fifth register 1436 and the sixth register 1437 that are connected in series may be provided. Similarly, in order to enable the second decimal-frequency control word, the rising-edge control word and the falling-edge control word outputted by the second DCO sub-circuit to maintain synchronous, the seventh register 1438 and the eighth register 1439 that are connected in series may be provided.

In the present example, the fifth register 1436 may be configured for receiving the first decimal-frequency control word sent by the first DCO sub-circuit, and the third data-comparator sub-circuit 1433 may be configured for comparing the first decimal-frequency control word outputted by the sixth register 1437 and zero and outputting the third comparison result. The seventh register 1438 may be configured for receiving the second decimal-frequency control word sent by the second DCO sub-circuit, and the fourth data-comparator sub-circuit 1434 may be configured for performing the second decimal-frequency control word outputted by the eighth register 1439 and zero and outputting the fourth comparison result. The fifth register 1436 and the seventh register 1438 may have the configuration the same as that of the first register 1012 in FIG. 10, and the sixth register 1437 and the eighth register 1439 may have the configuration the same as that of the second register 1013 in FIG. 10.

It should be noted that, although FIG. 14C shows the example in which the fifth register 1436 and the sixth register 1437 are configured for buffering the first decimal-frequency control word sent by the first DCO sub-circuit, the embodiments of the present disclosure are not limited thereto. For example, the fifth register 1436 and the sixth register 1437 may be provided between the third data-comparator sub-circuit 1433 and the indicator-signal generating sub-circuit 1435, and be configured for buffering the comparison result of the third data-comparator sub-circuit 1433, to synchronize the first comparison result, the second comparison result and the third comparison result. Similarly, the seventh register 1438 and the eighth register 1439 may be provided between the fourth data-comparator sub-circuit 1434 and the indicator-signal generating sub-circuit 1435, and be configured for buffering the comparison result of the fourth data-comparator sub-circuit 1434, to synchronize the first comparison result, the second comparison result and the fourth comparison result.

Figure 15A:
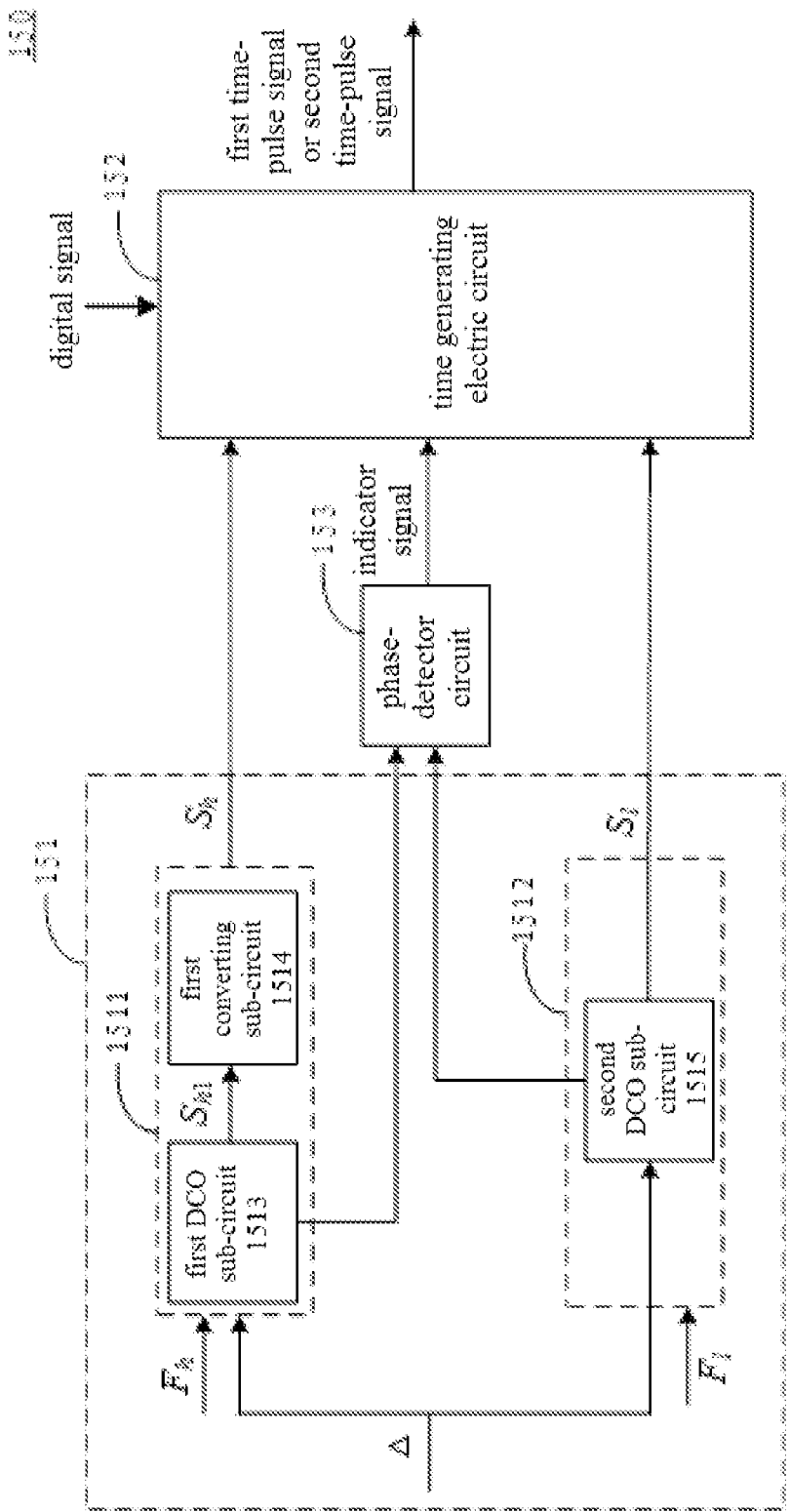
FIG. 15A shows a block diagram of the digit-to-time converting electric circuit according to some embodiments of the present disclosure.

FIG. 15A shows a block diagram of the digit-to-time converting electric circuit according to some embodiments of the present disclosure.

Referring to FIG. 15A, the digit-to-time converting electric circuit 150 may comprise a signal generating electric circuit 151, a time generating electric circuit 152 and a phase-detector circuit 153. The signal generating electric circuit 151 may comprise a first generating electric circuit 1511 and a second generating electric circuit 1512. The first generating electric circuit 1511 may be configured for, based on a first frequency control word $F_h$ and a reference time unit Δ, generating a periodic first output signal $S_h$. The second generating electric circuit 1512 may be configured for, based on the second frequency control word $F_l$ and the reference time unit Δ, generating the periodic second output signal $S_l$. The time generating electric circuit 152 may be configured for receiving the digital signal, the first output signal $S_h$ and the second output signal Si, and, based on the digital signal, the first output signal $S_h$ and the second output signal $S_l$, generating a first time-pulse signal or a second time-pulse signal corresponding to the digital signal.

The signal generating electric circuit 151 may be implemented by using the signal generating electric circuit according to some embodiments illustrated in FIG. 12. The signal generating electric circuit 131 may comprise a first generating electric circuit 1511 and a second generating electric circuit 1512. The first generating electric circuit 1511 may comprise a first DCO sub-circuit 1513 and a first converting sub-circuit 1514. The second generating electric circuit 1512 may comprise a second DCO sub-circuit 1515.

For example, in the present example, the first frequency control word $F_h$ may comprise a first integer part and a first fractional part. The second frequency control word $F_l$ comprises a second integer part and a second fractional part. The second fractional part is 0. In other words, the second frequency control word $F_l$ may be an integer. The second frequency control word $F_l$ (i.e., the second integer part) is equal to the first integer part of the first frequency control word $F_h$. The first fractional part is not 0. In other words, the first fractional part and the second fractional part are not equal.

For example, the first DCO sub-circuit 1513 may be configured for, based on a first frequency control word $F_h$ and a reference time unit Δ, generating a first intermediate signal $S_{h1}$; and when generating the first intermediate signal $S_{h1}$, outputting a first rising-edge control word corresponding to the rising edge of the first intermediate signal $S_{h1}$, a first falling-edge control word corresponding to the falling edge of the first intermediate signal $S_{h1}$ and a first decimal-frequency control word corresponding to the period switching of the first intermediate signal $S_{h1}$. The first converting sub-circuit 1514 may be configured for converting the first intermediate signal $S_{h1}$ into the first output signal $S_h$. In an embodiment in which the first DCO sub-circuit comprises the time-average-frequency direct-period synthesizer illustrated in FIG. 10, the first falling-edge control word corresponds to the selection signal outputted by the second register 1013 of the first DCO sub-circuit, the first rising-edge control word corresponds to the selection signal outputted by the fourth register 1023 of the first DCO sub-circuit, and the first decimal-frequency control word corresponds to the signal that is fed back from the first register 1012 of the first DCO sub-circuit to the first adder 1011.

For example, the second DCO sub-circuit 1515 may be configured for, based on the second frequency control word $F_l$ and the reference time unit Δ, generating the periodic second output signal $S_l$. In an embodiment in which the second DCO sub-circuit comprises the time-average-frequency direct-period synthesizer 100 illustrated in FIG. 10, the second falling-edge control word corresponds to the selection signal outputted by the second register 1013 of the second DCO sub-circuit, and the second rising-edge control word corresponds to the selection signal outputted by the fourth register 1023 of the second DCO sub-circuit.

For example, the phase-detector circuit 153 may be configured for, based on the first rising-edge control word, the second rising-edge control word, the first falling-edge control word, the second falling-edge control word and the first decimal-frequency control word, generating an indicator signal indicating that the phase of the first output signal $S_h$ and the phase of the second output signal $S_l$ are aligned. Because metastable state appears when the phase difference between the phase of the first output signal $S_h$ and the phase of the second output signal $S_l$ is extremely small, it is very difficult to directly compare the first output signal $S_h$ and the second output signal $S_l$. By using the first rising-edge control word, the first falling-edge control word and the first decimal-frequency control word, which are outputted by the first DCO sub-circuit, and the second rising-edge control word and the second falling-edge control word, which are outputted by the second DCO sub-circuit, the phase relation between the first output signal $S_h$ and the second output signal $S_l$ may be obtained, whereby, when the phase difference between the phase of the first output signal $S_h$ and the phase of the second output signal $S_l$ is very small, the phase comparison can still be performed. An example of the phase-detector circuit 153 will be described below with reference to FIG. 15B.

Figure 15B:
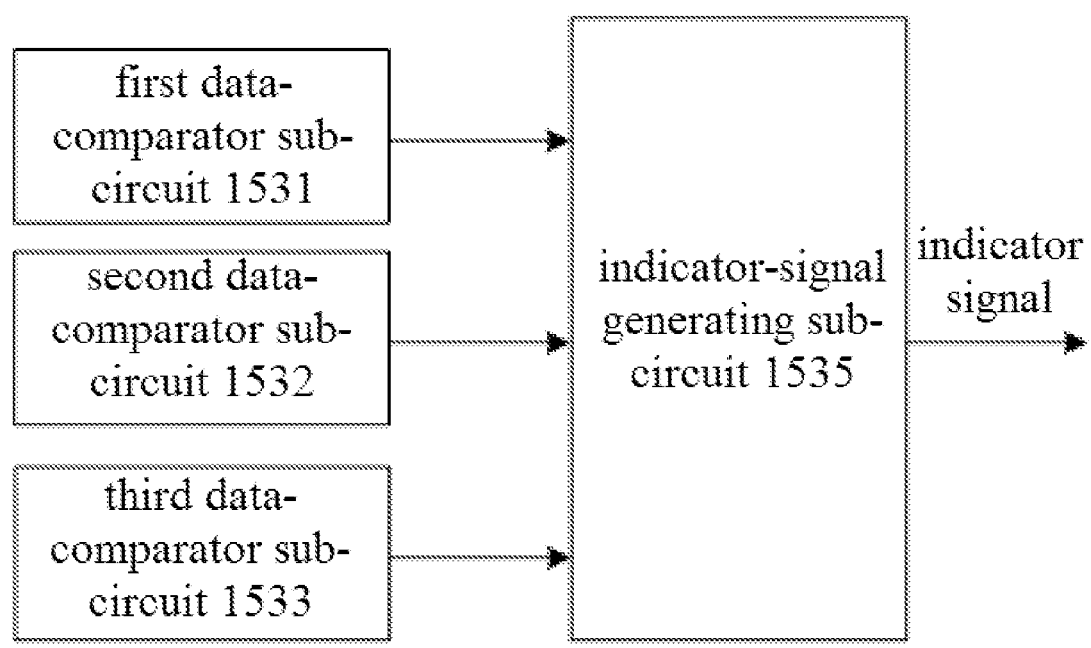
FIG. 15B shows an example of the phase-detector circuit in FIG. 15A.

FIG. 15B shows a schematic diagram of the phase-detector circuit 153 according to some embodiments of the present disclosure.

Referring to FIG. 15B, the phase-detector circuit 153 may comprise a first data-comparator sub-circuit 1531, a second data-comparator sub-circuit 1532 and a third data-comparator sub-circuit 1533. Because the second frequency control word $F_l$ used by the second DCO sub-circuit 1515 is an integer, then, as compared with the phase-detector circuit 143 in FIG. 14B, the phase-detector circuit 153 may not comprise the fourth data-comparator sub-circuit. The first data-comparator sub-circuit 1531 may be configured for comparing the first rising-edge control word and the second rising-edge control word and outputting a first comparison result. The second data-comparator sub-circuit 1532 may be configured for comparing the first falling-edge control word and the second falling-edge control word and outputting a second comparison result. The third data-comparator sub-circuit 1533 may be configured for comparing the first decimal-frequency control word and zero and outputting a third comparison result. The indicator-signal generating sub-circuit 1535 may be configured for, when the first comparison result indicates that the first rising-edge control word and the second rising-edge control word are equal, the second comparison result indicates that the first falling-edge control word and the second falling-edge control word are equal and the third comparison result indicates that the first decimal-frequency control word is equal to zero, outputting an indicator signal indicating that the phase of the first output signal $S_h$ and the phase of the second output signal $S_l$ are aligned; and, in other cases (for example, when the first comparison result indicates that the first rising-edge control word and the second rising-edge control word are not equal, or the second comparison result indicates that the first falling-edge control word and the second falling-edge control word are not equal, or the third comparison result indicates that the first decimal-frequency control word is not equal to zero), not outputting a signal or outputting a signal indicating that the phase of the first output signal $S_h$ and the phase of the second output signal $S_l$ are not aligned.

For example, the first data-comparator sub-circuit 1431, the second data-comparator sub-circuit 1432, the third data-comparator sub-circuit 1433 and the indicator-signal generating sub-circuit 1435 may be implemented by using combinational logic circuit.

Figure 15C:
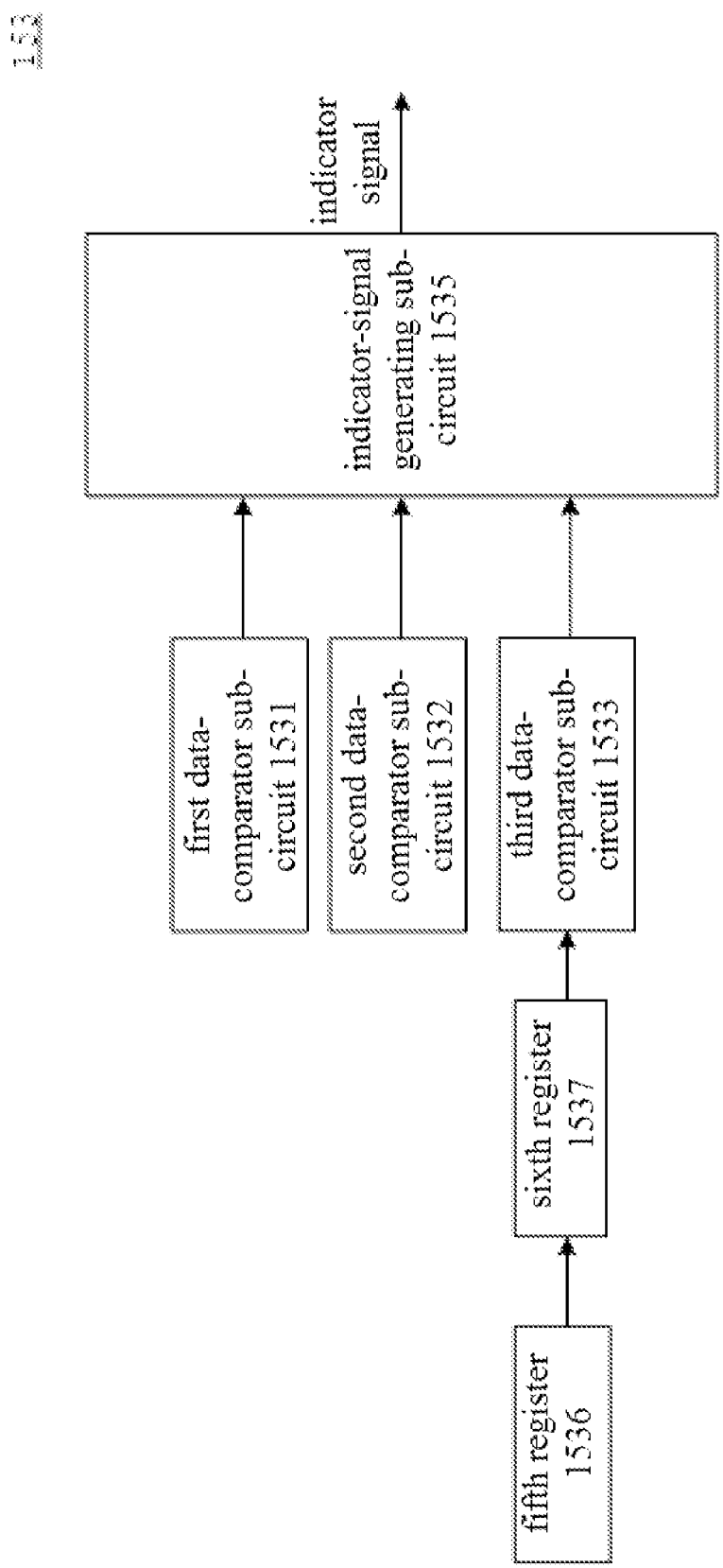
FIG. 15C shows another example of the phase-detector circuit in FIG. 15A.

In an example, referring to FIG. 15C, in an embodiment in which both of the first DCO sub-circuit 1513 and the second DCO sub-circuit 1515 comprise the time-average-frequency direct-period synthesizer 100 illustrated in FIG. 10, the phase-detector circuit 153 may further comprise a fifth register 1536 and a sixth register 1537 that are connected in series. Referring to FIG. 10, the falling-edge control word outputted by the second register 1013 passes through the first register 1012 and the second register 1013, and the rising-edge control word outputted by the fourth register 1023 passes through the third register 1022 and the fourth register 1023. Therefore, in order to enable the first decimal-frequency control word, the rising-edge control word and the falling-edge control word outputted by the first DCO sub-circuit to maintain synchronous, the fifth register 1536 and the sixth register 1537 that are connected in series may be provided.

In the present example, the fifth register 1536 may be configured for receiving the first decimal-frequency control word sent by the first DCO sub-circuit 1513, and the third data-comparator sub-circuit 1533 may be configured for comparing the first decimal-frequency control word outputted by the sixth register 1537 and zero and outputting the third comparison result. The fifth register 1536 may have the configuration the same as that of the first register 1012 in FIG. 10, and the sixth register 1537 may have the configuration the same as that of the second register 1013 in FIG. 10.

It should be noted that, although FIG. 15C shows the example in which the fifth register 1536 and the sixth register 1537 are configured for buffering the first decimal-frequency control word sent by the first DCO sub-circuit, the embodiments of the present disclosure are not limited thereto. For example, the fifth register 1536 and the sixth register 1537 may be provided between the third data-comparator sub-circuit 1533 and the indicator-signal generating sub-circuit 1535, and be configured for buffering the comparison result of the third data-comparator sub-circuit 1533, to synchronize the first comparison result, the second comparison result and the third comparison result.

Figure 16:
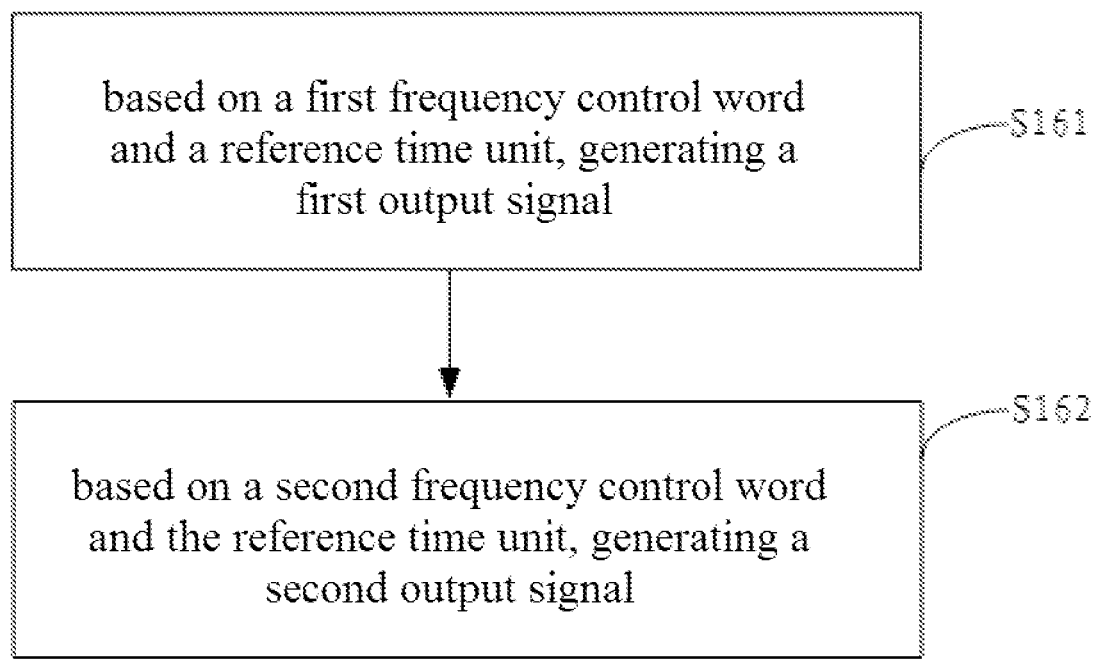
FIG. 16 shows a flow chart of the signal generating method according to some embodiments of the present disclosure.

At least an embodiment of the present disclosure further provides a signal generating method. FIG. 16 shows a flow chart of the signal generating method according to at least an embodiment of the present disclosure.

The signal generating method according to at least an embodiment of the present disclosure may comprise steps S161 and S162.

Step S161: based on a first frequency control word and a reference time unit, generating a periodic first output signal; and Step S162: based on a second frequency control word and the reference time unit, generating a periodic second output signal.

In some embodiments, regarding the signal generating electric circuit illustrated in FIG. 2, the first frequency control word may comprise a first integer part and a first fractional part, the second frequency control word comprises a second integer part and a second fractional part, the first integer part is equal to the second integer part, the first fractional part and the second fractional part are not equal, and a period of the first output signal and a period of the second output signal are not equal. The characteristics of the reference time unit may refer to the description above.

In some embodiments, the step S161 may comprise: based on the first frequency control word and the reference time unit, generating a first intermediate signal; and converting the first intermediate signal into the first output signal. The first intermediate signal may be generated based on the TAF method. The method of generating the first intermediate signal may refer to the embodiments described above, and the description on it is omitted here.

For example, the step of converting the first intermediate signal into the first output signal may comprise: filtering out a high-frequency component of the first intermediate signal, to convert the first intermediate signal into the first output signal.

In some embodiments, the step S162 may comprise: based on the second frequency control word and the reference time unit, generating the second intermediate signal; and converting the second intermediate signal into the second output signal. The second intermediate signal may be generated based on the TAF method. The method of generating the second intermediate signal may refer to the embodiments described above, and the description on it is omitted here.

For example, the step of converting the second intermediate signal into the second output signal may comprise: filtering out a high-frequency component of the second intermediate signal, to convert the second intermediate signal into the second output signal.

In some embodiments, the periodic inequality between the period of the first output signal and the period of the second output signal is related to the reference time unit and the decimal difference between the first fractional part and the second fractional part. Therefore, by providing suitable reference time unit Δ, first frequency control word and second frequency control word, a signal whose time resolution is of the order of magnitude of femtoseconds or picoseconds may be obtained.

In some embodiments, regarding the signal generating electric circuit illustrated in FIG. 12, the first frequency control word may comprise a first integer part and a first fractional part. The second frequency control word comprises a second integer part and a second fractional part. The second fractional part is 0. In other words, the second frequency control word may be an integer. The second frequency control word (i.e., the second integer part) is equal to the first integer part of the first frequency control word. The first fractional part is not 0. In other words, the first fractional part and the second fractional part are not equal.

In some embodiments, the step S161 may comprise: based on a first frequency control word and a reference time unit, generating a first intermediate signal; and converting the first intermediate signal into the first output signal. The first intermediate signal may be generated based on the TAF method. The method of generating the first intermediate signal may refer to the embodiments described above, and the description on it is omitted here.

For example, the step of converting the first intermediate signal into the first output signal may comprise: filtering out a high-frequency component of the first intermediate signal, to convert the first intermediate signal into the first output signal.

In some embodiments, the periodic second output signal may be generated based on the TAF method. For example, the step S162 may comprise: based on a second frequency control word and the reference time unit, generating a periodic second output signal. The second output signal has merely one period, and the method of generating the periodic second output signal may refer to the embodiments described above, and the description on it is omitted here.

In some embodiments, the periodic inequality between the period of the first output signal and the period of the second output signal is related to the reference time unit $\Delta$ and the first fractional part of the first frequency control word $F_h$. Accordingly, by providing suitable reference time unit $\Delta$ and first frequency control word, a signal whose time resolution is of the order of magnitude of femtoseconds or picoseconds may be obtained.

Figure 17:
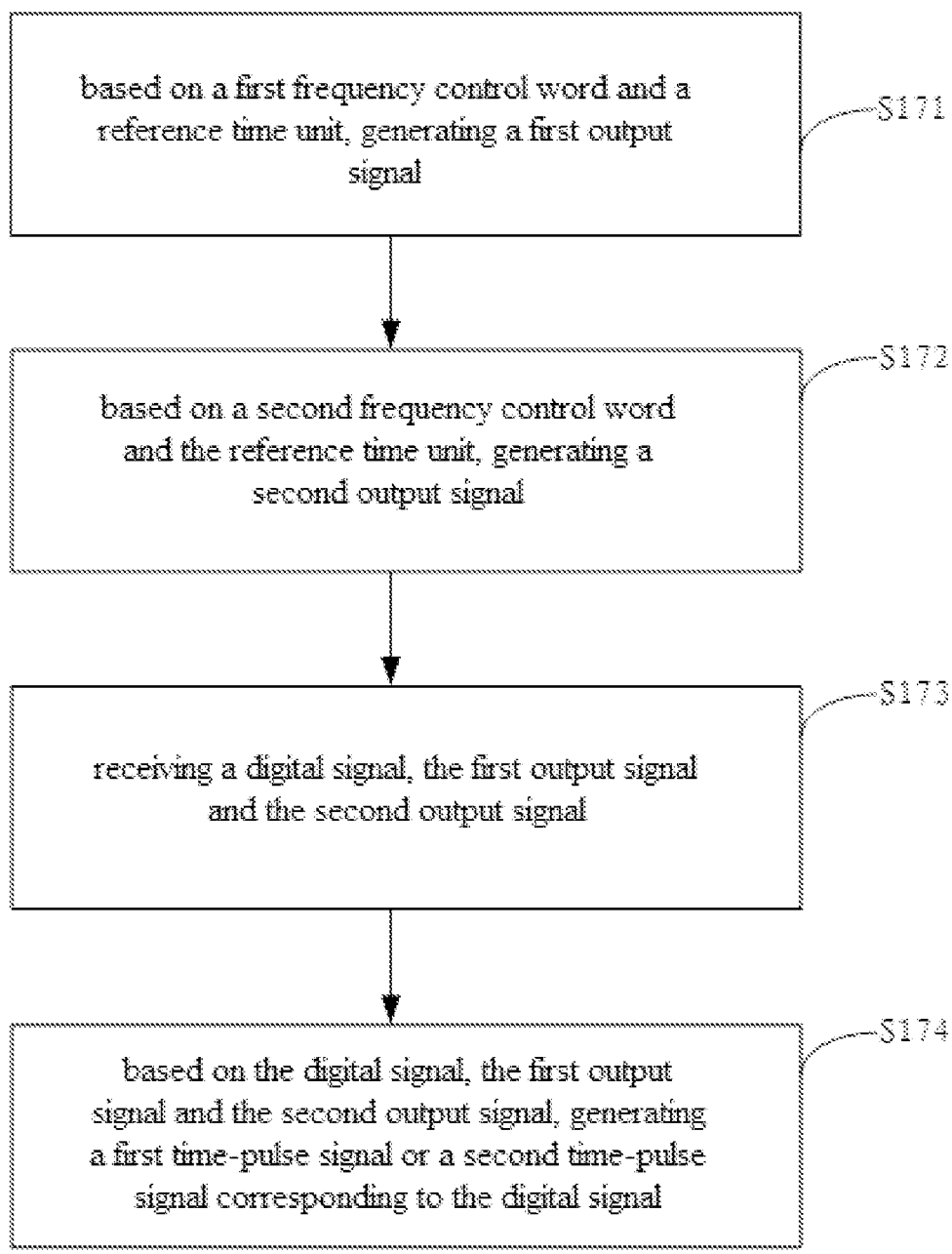
FIG. 17 shows a flow chart of the digit-to-time converting method according to some embodiments of the present disclosure.

At least an embodiment of the present disclosure further provides a digit-to-time converting method. FIG. 17 shows a flow chart of the digit-to-time converting method according to at least an embodiment of the present disclosure.

Referring to FIG. 17, the digit-to-time converting method according to at least an embodiment of the present disclosure may comprise steps S171, S172, S173 and S174.

Step S171: based on a first frequency control word and a reference time unit, generating a periodic first output signal.

Some embodiments of the step S171 may refer to the step S161 described above.

Step S172: based on a second frequency control word and the reference time unit, generating a periodic second output signal.

Some embodiments of the step S172 may refer to the step S162 described above.

For example, the step S171 may be executed by the first generating electric circuit according to any one of the above embodiments, and the step S172 may be executed by the second generating electric circuit according to any one of the above embodiments.

By using the steps S171 and S172, the periodic first output signal and the periodic second output signal can be generated, wherein the periodic inequality between the period of the first output signal and the period of the second output signal is related to the reference time unit, the first frequency control word and the second frequency control word. In some embodiments, the periodic inequality between the period of the first output signal and the period of the second output signal is related to the reference time unit and the decimal difference between the first fractional part and the second fractional part. In some embodiments, the periodic inequality between the period of the first output signal and the period of the second output signal is related to the reference time unit and the first fractional part of the first frequency control word $F_h$. Therefore, depending on the embodiments of the step S172, the periodic inequality between the period of the first output signal and the period of the second output signal may be expressed by using Formula (11) or Formula (15).

Step S173: receiving the digital signal, the first output signal and the second output signal.

In some embodiments, the digital signal may have n bits that are expressed as <n−1:0>, wherein n may represent the bit width of the digital signal, and n is an integer greater than or equal to 1.

Step S174: based on the digital signal, the first output signal and the second output signal, generating a first time-pulse signal or a second time-pulse signal corresponding to the digital signal.

For example, the steps S173 and S174 may be executed by the time generating electric circuit and the phase-detector circuit according to any one of the above embodiments.

For example, the characteristics of the first time-pulse signal may refer to the relevant description on the first time-pulse signal in the embodiments of the digit-to-time converting electric circuit above, and the characteristics of the second time-pulse signal may refer to the relevant description on the second time-pulse signal in the embodiments of the digit-to-time converting electric circuit above.

In some embodiments, the step S174 may comprise, based on the bit width of the digital signal, the first output signal and the second output signal, generating a first time-pulse signal or a second time-pulse signal corresponding to the digital signal.

In some embodiments, as described above, starting from the time moment when the phase of the first output signal and the phase of the second output signal are aligned, after m periods have passed, the time difference between the rising edge of the m-th period of the first output signal $S_h$ and the rising edge of the m-th period of the second output signal $S_l$ is m·$t_R$, wherein m is an integer greater than or equal to 1.

In an example, the step S174 may comprise: starting to count the periods of the first output signal from the time moment when the phase of the first output signal and the phase of the second output signal are aligned (for example, starting from 1 to count); starting to count the periods of the second output signal from the time moment when the phase of the first output signal and the phase of the second output signal are aligned; and at the time moment corresponding to the rising edge of the n-th period of the first output signal, setting the first time-pulse signal to be 1, and at the time moment corresponding to the rising edge of the n-th period of the second output signal, setting the first time-pulse signal to be 0. For example, this step may comprise starting to count the periods of the first output signal from the time moment when the phase of the first output signal and the phase of the second output signal are aligned, wherein when the counted value is n, the corresponding period of the first output signal is the n-th period of the first output signal. For example, this step may comprise starting to count the periods of the second output signal from the time moment when the phase of the first output signal and the phase of the second output signal are aligned, wherein when the counted value is n, the corresponding period of the second output signal is the n-th period of the second output signal. Accordingly, the first time-pulse signal whose pulse width (i.e., the first minimum time interval) is DeltaT can be generated.

Additionally or alternatively, the step S174 may comprise: at the time moment corresponding to the rising edge of the n-th period of the first output signal, setting the first sub-pulse signal to be 1, and, at the time moment corresponding to the rising edge of the n-th period of the second output signal, setting the second sub-pulse signal of the second time-pulse signal to be 1. For example, this step may comprise starting to count the periods of the first output signal from the time moment when the phase of the first output signal and the phase of the second output signal are aligned, wherein when the counted value is n, the corresponding period of the first output signal is the n-th period of the first output signal. For example, this step may comprise starting to count the periods of the second output signal from the time moment when the phase of the first output signal and the phase of the second output signal are aligned, wherein when the counted value is n, the corresponding period of the second output signal is the n-th period of the second output signal. Accordingly, the second time-pulse signal comprising the first sub-pulse signal and the second sub-pulse signal can be generated, and the second minimum time interval corresponding to the first sub-pulse signal and the second sub-pulse signal is DeltaT.

In some embodiments, the digit-to-time converting method may further comprise: determining a phase relation between the first output signal and the second output signal, to generate an indicator signal indicating that a phase of the first output signal and a phase of the second output signal are aligned. In such a case, the step S174 may comprise: based on the digital signal, the first output signal, the second output signal and the indicator signal, generating the first time-pulse signal or the second time-pulse signal. For example, in the step S174, when the indicator signal (which indicator signal indicates that the phase of the first output signal and the phase of the second output signal are aligned) has been received, the counting of the period of the first output signal and the period of the second output signal is started.

The method of determining the phase relation between the first output signal and the second output signal may refer to the embodiments described above, and the description on it is omitted here.

In some embodiments, because the periodic inequality between the period of the first output signal and the period of the second output signal may be of the order of magnitude of femtoseconds or picoseconds, the first time-pulse signal whose pulse width is of the order of magnitude of femtoseconds or picoseconds can be generated, or the second time-pulse signal comprising the first sub-pulse signal and the second sub-pulse signal whose time interval is of the order of magnitude of femtoseconds or picoseconds can be generated.

In some embodiments, the digit-to-time converting method illustrated in FIG. 17 may be applied to the digit-to-time converting electric circuit according to the embodiments of the present disclosure.

In the present disclosure, it should be further noted that:

(1) The drawings of the embodiments of the present disclosure merely relate to the structures involved in the embodiments of the present disclosure, and the other structures may refer to common designs.

(2) Subject to the avoiding of any conflict, the embodiments and the features of the embodiments of the present disclosure may be combined to obtain new embodiments.

The above are merely illustrative embodiments of the present disclosure, and are not intended to limit the protection scope of the present disclosure. The protection scope of the present disclosure is determined by the appended claims.

The invention claimed is:

1. A signal generating electric circuit, comprising:
a first generating electric circuit configured for, based on a first frequency control word and a reference time unit, generating a periodic first output signal; and
a second generating electric circuit configured for, based on a second frequency control word and the reference time unit, generating a periodic second output signal;
wherein the first frequency control word comprises a first integer part and a first fractional part, the second frequency control word comprises a second integer part and a second fractional part, the first integer part is equal to the second integer part, the first fractional part and the second fractional part are not equal, and a period of the first output signal and a period of the second output signal are not equal.

2. The signal generating electric circuit according to claim 1, wherein a periodic inequality between the period of the first output signal and the period of the second output signal is related to the reference time unit and a decimal difference between the first fractional part and the second fractional part.

3. The signal generating electric circuit according to claim 1, wherein the first generating electric circuit comprises a first digitally controlled oscillator sub-circuit and a first converting sub-circuit, the first digitally controlled oscillator sub-circuit is configured for, based on the first frequency control word and the reference time unit, generating a first intermediate signal, and the first converting sub-circuit is configured for converting the first intermediate signal into the first output signal;

the second generating electric circuit comprises a second digitally controlled oscillator sub-circuit and a second converting sub-circuit, and the second digitally controlled oscillator sub-circuit is configured for, based on the second frequency control word and the reference time unit, generating a second intermediate signal, and the second converting sub-circuit is configured for converting the second intermediate signal into the second output signal;

the first intermediate signal is generated by interlacing between a pulse having a first primitive period and a pulse having a second primitive period, and a first average period of the first intermediate signal is expressed by using the following formula:

$$T_h = (1-r_h) \cdot T_A + r_h \cdot T_B,$$

wherein $T_h$ represents the first average period of the first intermediate signal, $r_h$ represents the first fractional part, $T_A$ represents the first primitive period, and $T_B$ represents the second primitive period; and the second intermediate signal is generated by interlacing between a pulse having the first primitive period and a pulse having the second primitive period, and a second average period of the second intermediate signal is expressed by using the following formula:

$$T_l = (1-r_l) \cdot T_A + r_l \cdot T_B,$$

wherein $T_l$ represents the second average period of the second intermediate signal, and $r_l$ represents the second fractional part.

4. The signal generating electric circuit according to claim 3, wherein the first converting sub-circuit comprises a first filter, and the first filter is configured for filtering out a high-frequency component of the first intermediate signal to obtain the first output signal.

5. The signal generating electric circuit according to claim 4, wherein parameters of the first filter are determined according to a mean frequency of the first intermediate signal and a least significant bit of the first fractional part.

6. The signal generating electric circuit according to claim 5, wherein the parameters of the first filter include a bandwidth of the first filter, and the bandwidth of the first filter is determined according to the following formula:

$$Bwlp1 \leq f_{h1} \cdot r_{LSB1},$$

wherein Bwlp1 is the bandwidth of the first filter, $r_{LSB1}$ is a value corresponding to the least significant bit of the first fractional part, $$f_{h1} = \frac{1}{F_h \cdot \Delta}$$

is a mean frequency of the first intermediate signal, $F_h$ is the first frequency control word, and $\Delta$ is the reference time unit.

7. The signal generating electric circuit according to claim 3, wherein the second converting sub-circuit comprises a second filter, and the second filter is configured for filtering out a high-frequency component of the second intermediate signal to obtain the second output signal.

8. The signal generating electric circuit according to claim 7, wherein parameters of the second filter are determined according to a mean frequency of the second intermediate signal and a least significant bit of the second fractional part.

9. The signal generating electric circuit according to claim 8, wherein the parameters of the second filter include a bandwidth of the second filter, and the bandwidth of the second filter is determined according to the following formula:

$$\text{Bwlp2} \leq f_{h2} \cdot r_{LSB2},$$

wherein Bwlp2 represents the bandwidth of the second filter, $r_{LSB2}$ is a value corresponding to the least significant bit of the second fractional part, is a mean frequency of the second intermediate signal, $F_l$ is the second frequency control word, and $\Delta$ is the reference time unit.

10. The signal generating electric circuit according to claim 3, wherein both of the first digitally controlled oscillator sub-circuit and the second digitally controlled oscillator sub-circuit comprise a time-average-frequency direct-period synthesizer.

11. The signal generating electric circuit according to claim 1, wherein the signal generating electric circuit further comprises a reference-time-unit generating electric circuit;
the reference-time-unit generating electric circuit is configured for generating the reference time unit; and
the reference-time-unit generating electric circuit comprises:
a voltage-controlled oscillator configured for oscillating with a preset oscillation frequency;
a phase-locked-loop circuit configured for locking an output frequency of the voltage-controlled oscillator as a reference output frequency; and
K output terminals configured for outputting K output signals whose phases are evenly separated, wherein K is a positive integer greater than 1;
wherein the reference output frequency is expressed as $f_\Delta$, the reference time unit is a time span between any two neighboring output signals outputted by the K output terminals, the reference time unit is expressed as $\Delta$, and $\Delta = 1/(K \cdot f_\Delta)$.

12. The signal generating electric circuit according to claim 1, further comprising: a control circuit;
wherein the control circuit is configured for determining the first frequency control word and the second frequency control word, outputting the first frequency control word to the first generating electric circuit, and outputting the second frequency control word to the second generating electric circuit.

13. A digit-to-time converting electric circuit, comprising:
the signal generating electric circuit according to claim 1; and
a time generating electric circuit configured for receiving a digital signal, the first output signal and the second output signal; and based on the digital signal, the first output signal and the second output signal, generating a first time-pulse signal or a second time-pulse signal corresponding to the digital signal;
wherein a first minimum time interval between a rising edge and a falling edge of the first time-pulse signal is related to the reference time unit, the first fractional part and the second fractional part; or, the second time-pulse signal comprises a first sub-pulse signal and a second sub-pulse signal, and a second minimum time interval between a rising edge of the first sub-pulse signal and a rising edge of the second sub-pulse signal is related to the reference time unit, the first fractional part and the second fractional part.

14. The digit-to-time converting electric circuit according to claim 13, further comprising a phase-detector circuit;
wherein the phase-detector circuit is configured for determining a phase relation between the first output signal and the second output signal, to generate an indicator signal indicating that a phase of the first output signal and a phase of the second output signal are aligned; and
the time generating electric circuit is configured for, based on the digital signal, the first output signal, the second output signal and the indicator signal, generating the first time-pulse signal or the second time-pulse signal.

15. The digit-to-time converting electric circuit according to claim 14, wherein the first generating electric circuit comprises a first digitally controlled oscillator sub-circuit configured for, based on the first frequency control word and the reference time unit, generating a first intermediate signal and a first converting sub-circuit configured for converting the first intermediate signal into the first output signal, and the second generating electric circuit comprises a second digitally controlled oscillator sub-circuit configured for, based on the second frequency control word and the reference time unit, generating the second intermediate signal and a second converting sub-circuit configured for converting the second intermediate signal into the second output signal;
the first generating electric circuit is further configured for, when generating the first intermediate signal, outputting a first rising-edge control word corresponding to a rising edge of the first intermediate signal, a first falling-edge control word corresponding to a falling edge of the first intermediate signal and a first decimal-frequency control word corresponding to period switching of the first intermediate signal;
the second generating electric circuit is further configured for, when generating the second intermediate signal, outputting a second rising-edge control word corresponding to the rising edge of the second intermediate signal, a second falling-edge control word corresponding to the falling edge of the second intermediate signal and a second decimal-frequency control word corresponding to period switching of the second intermediate signal; and
the phase-detector circuit is configured for, based on the first rising-edge control word, the second rising-edge control word, the first falling-edge control word, the second falling-edge control word, the first decimal-frequency control word and the second decimal-frequency control word, generating the indicator signal.

16. The digit-to-time converting electric circuit according to claim 15, wherein the phase-detector circuit is configured for, when the first rising-edge control word is equal to the second rising-edge control word, the first falling-edge control word is equal to the second falling-edge control word and both of the first decimal-frequency control word and the second decimal-frequency control word are equal to zero, generating the indicator signal.

17. The digit-to-time converting electric circuit according to claim 13, wherein the first minimum time interval or the second minimum time interval is expressed as:

$$DeltaT = n \cdot t_R,$$

wherein DeltaT represents the first minimum time interval or the second minimum time interval, n represents a bit width of the digital signal, $t_R$ represents a periodic inequality between the period of the first output signal and the period of the second output signal, and $t_R$ is expressed as:

$$t_R = (r_h - r_l) \cdot \Delta,$$

wherein $r_h$ represents the first fractional part, $r_l$ represents the second fractional part, and $\Delta$ represents the reference time unit.

18. A signal generating method, comprising:
based on a first frequency control word and a reference time unit, generating a periodic first output signal; and
based on a second frequency control word and the reference time unit, generating a periodic second output signal;
wherein the first frequency control word comprises a first integer part and a first fractional part, the second frequency control word comprises a second integer part and a second fractional part, the first integer part is equal to the second integer part, the first fractional part and the second fractional part are not equal, and a period of the first output signal and a period of the second output signal are not equal.

19. The signal generating method according to claim 18, wherein the step of, based on the first frequency control word and the reference time unit, generating the periodic first output signal comprises:
based on the first frequency control word and the reference time unit, generating a first intermediate signal; and
converting the first intermediate signal into the first output signal; and
the step of based on a second frequency control word and the reference time unit, generating a periodic second output signal comprises:
based on the second frequency control word and the reference time unit, generating a second intermediate signal; and
converting the second intermediate signal into the second output signal;
wherein the first intermediate signal is generated by interlacing between a pulse having a first primitive period and a pulse having a second primitive period, and a first average period of the first intermediate signal is expressed by using the following formula:

$$T_h = (1 - r_h) \cdot T_A + r_h \cdot T_B,$$

wherein $T_h$ represents the first average period of the first intermediate signal, $r_h$ represents the first fractional part, $T_A$ represents the first primitive period, and $T_B$ represents the second primitive period; and
wherein the second intermediate signal is generated by interlacing between a pulse having the first primitive period and a pulse having the second primitive period, and a second average period of the second intermediate signal is expressed by using the following formula:

$$T_l = (1 - r_l) \cdot T_A + r_l \cdot T_B,$$

wherein $T_l$ represents the second average period of the second intermediate signal, $r_l$ represents the second fractional part, $T_A$ represents the first primitive period, and $T_B$ represents the second primitive period.

20. The signal generating method according to claim 19, wherein the step of converting the first intermediate signal into the first output signal comprises:
filtering out a high-frequency component of the first intermediate signal, to convert the first intermediate signal into the first output signal; and
the step of converting the second intermediate signal into the second output signal comprises:
filtering out a high-frequency component of the second intermediate signal, to convert the second intermediate signal into the second output signal.

* * * * *